(12) United States Patent
Hirosaki et al.

(10) Patent No.: US 9,677,000 B2
(45) Date of Patent: Jun. 13, 2017

(54) FLUOROPHOR AND METHOD FOR PRODUCTION THEREOF AND ILLUMINATOR

(71) Applicant: NATIONAL INSTITUTE FOR MATERIALS SCIENCE, Tsukuba-shi, Ibaraki (JP)

(72) Inventors: Naoto Hirosaki, Tsukuba (JP); Rong-Jun Xie, Tsukuba (JP); Mamoru Mitomo, Tsukuba (JP)

(73) Assignee: NATIONAL INSTITUTE FOR MATERIALS SCIENCE, Tsukuba (JP)

(*) Notice: Subject to any disclaimer, the term of this patent is extended or adjusted under 35 U.S.C. 154(b) by 332 days.

(21) Appl. No.: 14/507,202

(22) Filed: Oct. 6, 2014

(65) Prior Publication Data
US 2015/0083966 A1  Mar. 26, 2015

Related U.S. Application Data

(62) Division of application No. 11/994,391, filed as application No. PCT/JP2006/312923 on Jun. 28, 2006, now Pat. No. 8,883,039.

(30) Foreign Application Priority Data

Jul. 1, 2005 (JP) ................. 2005-193283

(51) Int. Cl.
*C09K 11/77* (2006.01)
*C09K 11/08* (2006.01)
(Continued)

(52) U.S. Cl.
CPC ...... *C09K 11/7734* (2013.01); *C09K 11/0883* (2013.01); *H01L 33/502* (2013.01);
(Continued)

(58) Field of Classification Search
CPC .................................................. C09K 11/7734
(Continued)

(56) References Cited

U.S. PATENT DOCUMENTS 6,066,861 A   5/2000  Hohn et al.
7,074,346 B2  7/2006  Yamada et al.
(Continued)

FOREIGN PATENT DOCUMENTS

JP   H10-093146 A   4/1998
JP   H10-242513 A   9/1998
(Continued)

OTHER PUBLICATIONS

Xie. Strong Green Emission from r-SiAlON Activated by Divalent Ytterbium under Blue Light Irradiation. J. Phys. Chem. B 2005, 109, 9490-9494.
(Continued)

*Primary Examiner* — Matthew E Hoban
(74) *Attorney, Agent, or Firm* — Sughrue Mion, PLLC

(57) ABSTRACT

A fluorophor includes: α-type sialon crystal which is expressed by a general formula: $(Li_{x1}, Eu_{x2})(Si_{12-(m+n)}Al_{m+n})(O_n N_{16-n})$, wherein x1 is an amount of solid solution of Li in a sialon unit cell, and x2 is an amount of solid solution of Eu in the sialon unit cell, wherein the parameters x1, x2, m, and n satisfy: $1.6 \leq x1 \leq 2.4$ (1), $0.001 \leq x2 \leq 0.4$ (2), $1.8 \leq m \leq 2.4$ (3), $0.8 \leq n \leq 1.2$ (4), wherein the α-type sialon crystal emits fluorescence with a peak in a wavelength region of from 550 nm to 575 nm upon irradiation of an excitation source.

6 Claims, 4 Drawing Sheets

(51) Int. Cl.
*H01L 33/50* (2010.01)
*H01L 51/50* (2006.01)

(52) U.S. Cl.
CPC ... *H01L 51/5036* (2013.01); *H01L 2224/45144* (2013.01); *H01L 2224/48091* (2013.01); *H01L 2224/48247* (2013.01); *H01L 2224/73265* (2013.01); *H01L 2224/8592* (2013.01); *H01L 2924/181* (2013.01)

(58) Field of Classification Search
USPC .................................................. 252/301.4 F
See application file for complete search history.

(56) References Cited

U.S. PATENT DOCUMENTS

| | | |
|---|---|---|
| 7,144,524 B2 | 12/2006 | Sakata et al. |
| 7,252,788 B2 | 8/2007 | Nagatomi et al. |
| 7,258,818 B2 | 8/2007 | Sakata et al. |
| 7,825,580 B2 | 11/2010 | Hirosaki et al. |
| 7,906,040 B2 | 3/2011 | Mitomo et al. |
| 7,910,023 B2 | 3/2011 | Xie et al. |
| 2004/0155225 A1 | 8/2004 | Yamada et al. |
| 2005/0012075 A1 | 1/2005 | Sakata et al. |
| 2006/0017365 A1 | 1/2006 | Nagatomi et al. |

FOREIGN PATENT DOCUMENTS

| | | |
|---|---|---|
| JP | H11-500584 A | 1/1999 |
| JP | 2000-034477 A | 2/2000 |
| JP | 2002-363554 A | 12/2002 |
| JP | 2003-336059 A | 11/2003 |
| JP | 2004-067837 A | 3/2004 |
| JP | 2004-186278 A | 7/2004 |
| JP | 2004-238505 A | 8/2004 |
| JP | 2004-238506 A | 8/2004 |
| JP | 2005-36038 A | 2/2005 |
| WO | 2005/052087 A | 9/2005 |

OTHER PUBLICATIONS

Sheu. White-Light Emission From Near UV InGaN—GaN LED Chip Precoated With Blue/Green/Red Phosphors. IEEE Photonics Technology Letters, vol. 15, No. 1, Jan. 2003.
Office Action, Taiwanese Patent Application No. 095123963, Aug. 12, 2012.
Xie. Eu2+-doped Ca-a-SiAlON: A yellow phosphor for white light-emitting diodes. Applied Physics Letters vol. 84, No. 26 2004.
Office Action issued in Korean Patent Application No. 10-2007-7029619 on Dec. 28, 2010.
Mukai, Nakamura, "White and UV LEDs," Oyo Buturi, vol. 68, 152-55 (1998).
J. W. H. van Krevel, "On new rare-earth doped M—Si—Al—O—N materials luminescence properties and oxidation resistance", Thesis, ISBN 90-386-2711-4, Eindhoven Technische Univ.
J. W. H. van Krevel et al. "Long wavelength Ca3+ emission in Y—Si—O—N materials", J. Alloys and Compounds, 268, 272-277(1998).
J. W. H. van Krevel et al, "Luminescence properties of terbium-, cerium-, or europium-doped a-sialon materials", J. Solid State Chem. 165, 19-24 (2002).
R. J. Xie et al, "Preparation and Luminescence spectra of calcium- and rare-earth (R=Eu, Tb and Pr) codoped a-SiAlON ceramics", J. Am. Ceram. SOC. 85, 1229-1234 (2002).

FLUOROPHOR AND METHOD FOR PRODUCTION THEREOF AND ILLUMINATOR

PRIORITY CLAIM

The present application is a divisional application of and claims the benefit of priority from U.S. patent application Ser. No. 11/994,391, filed on Dec. 31, 2007, which is a U.S. National Stage Application under 35 U.S.C. 371 and claims the benefit of priority from PCT/JP2006/312923, filed on Jun. 28, 2006, which is an International Application and claims the benefit of priority from Japanese Patent Application 2005-193283, filed on Jul. 1, 2005, the full disclosures of which are incorporated herein by reference.

TECHNICAL FIELD

The present invention relates to a phosphor comprising an inorganic compound as a main component and a manufacture thereof and an application thereof. More specifically, the application relates to a lighting apparatus and an emission apparatus of an image display device utilizing features of the phosphor, that is, properties to emit fluorescence of rather long wavelength from 530 nm to 585 nm.

BACKGROUND ART

A phosphor is utilized in a fluorescent display tube (VFD), a field emission display (EFD), a plasma display panel (PDP), a cathode-ray tube (CRT), a white color light-emitting diode (LED), and so on. In any of these applications, it is necessary to provide the phosphor with energy to excite the phosphor in order to render the emission and the phosphor is excited by the excitation source with high energy such as a vacuum ultraviolet ray, an ultraviolet ray, an electron beam, a blue light, and the like so as to emit a visible light. However, the phosphor deteriorates as a result of exposure to the above-mentioned excitation source such that there is an issue that the brightness of the phosphor decreases as it is used for a long period of time and the phosphor in which the brightness does not deteriorate is desired.

A white color LED has been used in a field of disaster light, beacon, and the like where reliability is required, a field of in-vehicle light, a back light of a mobile phone, and the like where reduction in size and weight is strongly desired, a field of direction board where visibility is required. The emission color of this white color LED, i.e., the white light may be obtained by mixing lights such that the white light is a mixture of a yellow light emitted by a phosphor and a blue light emitted by a blue color LED of wavelength from 430 to 480 nm as the emission source. The phosphor suitable for such white color LED is, by a small amount, arranged on the surface of the blue color LED chip as the emission source. Therefore, the phosphor which emits a yellow light upon irradiation of the blue color LED is desired for this application. Further, in view of reducing fluctuation of emission color caused by the temperature change of the application environment where the device is used, phosphor material emitting fluorescence with a small fluctuation in the emission intensity caused by the temperature change is also desired.

As the emission material to emit a yellow light upon irradiation of the blue color LED, garnet $((Y, Gd)_3(Al, Ga)_5O_{12}:Ce$, hereinafter, referred to as "YAG:Ce"), which is an oxide, is known. This phosphor was formed by replacing Y sites partially with Gd and Al sites partially with Ga, and doping $Ce^{3+}$ as the optically-activating ion at the same time (Non-patent reference 1). Although this phosphor is known as a highly efficient phosphor, the emission intensity is lowered as the temperature increases such that there is an issue that the emission color of the device varies depending on the temperature when it is used in the white color LED.

A phosphor comprising α-type sialon as a host crystal is proposed as a yellow color phosphor with a small temperature fluctuation of emission. The α-type sialon is a crystal to form an interstitial solid solution wherein Li, Ca, Mg, Y, or a lanthanide metal solid solves interstitially into the α-type $Si_3N_4$ crystal. The α-type $Si_3N_4$ crystal structure has two large spaces having diameters of about 0.1 nm interstitially in the unit cell. The structure is stabilized if metal atoms solid solve in such spaces. Therefore, the general formula of α-type sialon containing a metal element M is given by:

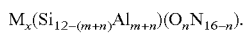

$$M_x(Si_{12-(m+n)}Al_{m+n})(O_nN_{16-n}).$$

Here, x is the number of M atoms contained in the α-type $Si_3N_4$ unit cell. Further, m corresponds to the number of Al—N bonds substituting Si—N bonds in the α-type $Si_3N_4$ crystal structure and m=δx (here, δ is the valence number of metal M). Here, n is the number of Al—O bonds substituting Si—N bonds. The electric neutrality is maintained by the above lattice substitution and interstitial solid solution. In the α-sialon, metal-nitrogen bonds are main bonds such that the α-sialon is a solid solution with a high percentage of nitrogen content.

It is publicly know before this patent application that α-type sialon becomes a phosphor if some of stabilizing metal atoms solid solving interstitially into the α-type sialon are substituted with optically activating metal ions (Non-patent references 2 to 4). One (Mr. Mitomo) of the present inventors found a phosphor material having Ca-α-sialon as a host crystal and being doped with $Eu^{2+}$ became a material to render a yellow color emission upon irradiation of a visible light of the violet-blue wavelength region (Patent references 1 and 2).

It is disclosed that this material emits a yellow light which is a complementary color of a blue color upon irradiation of the excitation light of the blue color LED, and that this material can be used as a phosphor for the white color LED by mixing lights of both colors (Patent reference 3). However, in these materials, there still is an issue that the emission intensity is not high enough because the amount of $Eu^{2+}$ solid solving into the α-type sialon lattice is small. Further, it was reported that Ca-α-sialon doped with $Eu^{2+}$ became a phosphor to emit a yellow light of 550 to 600 nm upon excitation by the blue light of 450 to 500 nm. However, in the composition having the best emission efficiency, the emission wavelength is from 580 to 600 nm such that a white color LED having the excitation source of the blue color LED emitting a light of 450 to 470 nm emits a white light with mixed colors which is a lamp color to have the correlated color temperature of 3000 K. Therefore, it was difficult to obtain the light emission of a daylight color, a day white color, and a white color of the correlated color temperature of 5000 K to 6500 K, which is usually used for an ordinary light.

The researches for adjusting solid solution metal and solid solution amount in the α-type sialon contained in the phosphor as the host crystal are conducted (Patent reference 4). Although Li-α-sialon doped with $Eu^{2+}$ is also disclosed in some of the researches, the emission intensity was not high enough for the practical use. It is inferred that this is because only a little amount of added Li and Eu were solid-solved in the lattice. Since the emission wavelength of Li-α-sialon phosphor in which Eu is solid-solved as described in Patent reference 4 is 585 nm and the phosphor and a blue LED may be combined together to produce a light bulb color, a phosphor with the emission wavelength of 580 nm or shorter was desired in order to produce a white color (chromaticity: x=0.33 and y=0.33). That is, in the α-type sialon with an Eu luminescence center, a yellow-green color phosphor rendering the emission of shorter wavelength was desired.

In the conventional technology of the lighting apparatus, a white color light-emitting diode of a combination of a blue color light-emitting diode device and a yellow color emission phosphor to be excited by the blue color is publicly known and is implemented in various kinds of lighting applications. As typical examples thereof, Japanese patent No. 2900928, "Light-emitting diode" (Patent reference 5); Japanese patent No. 2927279, "Light-emitting diode" (Patent reference 6); Japanese patent No. 3364229, "Wavelength conversion material and its manufacture and light emitting device" (Patent reference 7); and so on are cited. In these light-emitting diodes, phosphors being used particularly often are phosphors in the Ce-activated yttrium-aluminum-garnet (YAG:Ce) system and expressed by the general formula: $(Y, Gd)_3(Al, Ga)_5O_{12}:Ce^{3+}$.

However, the white color light-emitting diode comprising: a blue color light-emitting diode device and a phosphor in the YAG:Ce system has the emission intensity which is lowered when the temperature increases such that there was an issue that the emission color fluctuated because of deteriorated balance between the blue and yellow lights when the devices were warmed up as the time goes by after turning on the switch.

In these backgrounds, a phosphor which emits a yellow-green light of shorter wavelength than that of Ca-α-sialon doped with $Eu^{2+}$ and shows the brightness of smaller temperature fluctuation than the phosphor in the YAG:Ce system was desired.

[Patent reference 1] Japanese patent application publication No. 2002-363554
[Patent reference 2] Japanese patent application publication No. 2003-336059
[Patent reference 3] Japanese patent application publication No. 2004-186278
[Patent reference 4] Japanese patent application publication No. 2004-67837
[Patent reference 5] Japanese patent No. 2900928
[Patent reference 6] Japanese patent No. 2927279
[Patent reference 7] Japanese patent No. 3364229
[Non-patent reference 1] Mukai, Nakamura, "White and UV LEDs," OYO BUTURI, Vol. 68, 152-55 (1998).
[Non-patent reference 2] J. W. H. van Krevel, "On new rare-earth doped M—Si—Al—O—N materials luminescence properties and oxidation resistance," Thesis, ISBN 90-386-2711-4, Eindhoven Technische Universiteit Eindhoven (2000).
[Non-patent reference 3] J. W. H. van Krevel et al. "Long wavelength $Ca^{3+}$ emission in Y—Si—O—N materials," J. Alloys and Compounds, 268, 272-277 (1998))
[Non-patent reference 4] J. W. H. van Krevel et al, "Luminescence properties of terbium-, cerium-, or europium-doped α-sialon materials," J. Solid State Chem. 165, 19-24 (2002).
[Non-patent reference 5] R. J. Xie et al, "Preparation and Luminescence spectra of calcium- and rare-earth (R=Eu, Tb and Pr) codoped α-SiAlON ceramics," J. Am. Ceram. Soc. 85, 1229-1234 (2002).

DESCRIPTION OF THE INVENTION

Problems to be Solved by the Invention

The present invention was conceived in response to such desire. And one of the objects is to provide an inorganic phosphor which emits a yellow-green color with a high intensity of shorter wavelength than that of a rare earth activated sialon phosphor such as a conventional Ca-α-sialon, has the emission intensity fluctuated only slightly by the temperature change, and is chemically stable. Another object of the present invention is to provide a lighting apparatus having a small temperature fluctuation and an endurable emission apparatus of an image display device by utilizing such phosphor.

Means for Solving Problems

The present inventors conducted detailed researches about the phosphor having α-type sialon crystal as a host crystal under such situations and have found a phosphor including α-type sialon crystal having Li solid solution and a specific composition as a host crystal, which is activated by optically activating metal such as Mn, Ce, Pr, Nd, Sm, Eu, Tb, Dy, Er, Tm, or Yb, and had the emission intensity with a small fluctuation due to the temperature change and emitted fluorescence with higher intensity than that of the conventionally-reported phosphor having nitride or oxynitride as a host crystal. Further, it has been found that a phosphor having a specific composition in which a specific metal is solid solved emits a yellow-green light.

That is, it was found that a crystal of a specific composition became a phosphor emitting fluorescence having a high intensity and a small temperature fluctuation as a result of intensive researches about an inorganic compound of α-type sialon as a major component comprising: Li and an A element as a light-emitting ion (here, A is one or more kinds of elements selected from Mn, Ce, Pr, Nd, Sm, Eu, Tb, Dy, Er, Tm, and Yb). In particular, the inorganic compound activated by Eu was found to become a phosphor emitting a yellow-green light of a high intensity.

Further, it was found to be possible to obtain a white color light-emitting diode with a small temperature fluctuation and a high emission efficiency, and an image display device rendering bright coloring by utilizing such phosphor.

The phosphor of the present invention is a new phosphor containing a crystal as a host crystal having a totally different constituent elements and composition than those of sialon such as $Ca_{1.47}Eu_{0.03}Si_9Al_3N_{16}$ or the like as disclosed in Chapter 11 of Non-patent reference 2.

In general, a phosphor of an inorganic host crystal activated with Mn or a rare earth element as a luminescence center element A renders an emission in which an emission color and an intensity thereof vary according to an electronic state around the A element. For example, it was reported that the phosphor having a luminescence center of divalent Eu emitted a blue color, a green color, a yellow color, and a red color by changing the host crystal. That is, the emission color and the intensity of the emission of the phosphor would be totally different if the constituent element or a liganding environment in the crystal structure taking in A or a host crystal structure thereof is changed although the phosphor has a similar composition such that such phosphor would be regarded as a totally different phosphor. In the present invention, the phosphor has totally different composition and crystal as the host than those of any of sialon and nitride or oxynitride having been reported and the phosphor having such composition as the host so far has not been reported. Further, the phosphor having the composition of the present invention as the host emits fluorescence of higher intensity than a phosphor having a conventional crystal as the host. And the phosphor of a specific composition shows a yellow-green color emission.

The present inventors conducted intensive researches in consideration of the above-mentioned background so as to successfully provide a phosphor rendering emission with a high intensity in a specific wavelength region by implementing the configuration recited in any one from (1) to (11). Further, such phosphor having excellent light-emitting properties was successfully manufactured by utilizing the method recited in any one from (12) to (26). Further, the lighting apparatus and the image display device having excellent light-emitting properties were successfully provided by utilizing such phosphor and implementing the configuration recited in any one from (27) to (36). These configurations are recited in below (1) to (36).

(1) A phosphor comprising: α-type sialon crystal as a main component, which emits fluorescence with a peak in a wavelength region of from 400 to 700 nm upon irradiation of an excitation source,
  wherein the α-type sialon crystal comprises:
  at least Li;
  an A element (here, A is one or more kinds of elements selected from Mn, Ce, Pr, Nd, Sm, Eu, Tb, Dy, Er, Tm, and Yb);
  an M element (here, M is one or more kinds of metal elements other than Li and A);
  Si;
  Al;
  oxygen; and
  nitrogen,
  wherein the α-type sialon crystal is expressed by a general formula:

$$(Li_{x1}, A_{x2}, M_{x3})(Si_{12-(m+n)}Al_{m+n})(O_nN_{16-n}),$$

wherein x1 is an amount of solid solution of Li in a sialon unit cell, x2 is an amount of solid solution of A element in the sialon unit cell, and x3 is an amount of solid solution of M element in the sialon unit cell,
  wherein the parameters x1, x2, and x3 satisfy:

$$1.2 \leq x1 \leq 2.4 \quad (1),$$

$$0.001 \leq x2 \leq 0.4 \quad (2),$$

and $$0 \leq x3 \leq 1.0 \quad (3).$$

(2) The phosphor according to the above (1) wherein the parameters x1 and x3 satisfy:

$$1.6 \leq x1 \leq 2.2 \quad (4), \text{ and}$$

$$0 \leq x3 \leq 0.01 \quad (5).$$

(3) The phosphor according to the above (1) or (2) wherein the parameters m and n satisfy:

$$1.4 \leq m \leq 2.6 \quad (6), \text{ and}$$

$$0.1 \leq n \leq 1.3 \quad (7).$$

(4) The phosphor according to any one of the above (1) to (3)
  wherein the A element is Eu, and
  wherein the α-type sialon crystal emits the fluorescence with the peak in a wavelength region of from 530 nm to 580 nm upon irradiation of the excitation source.

(5) The phosphor according to any one of the above (1) to (4), wherein the α-type sialon crystal is expressed by a composition formula:

$$Li_aEu_bSi_cAl_dO_eN_f \text{ (here, assuming } a+b+c+d+e+f=1),$$

wherein:

$$0.043 \leq a \leq 0.078 \quad (8),$$

$$0.0002 \leq b \leq 0.008 \quad (9),$$

$$0.27 \leq c \leq 0.33 \quad (10),$$

$$0.08 \leq d \leq 0.12 \quad (11),$$

$$0.027 \leq e \leq 0.1 \quad (12),$$

and $$0.42 \leq f \leq 0.52 \quad (13).$$

(6) The phosphor according to any one of the above (1) to (5)
  wherein the parameters m and n satisfy:

$$1.8 \leq m \leq 2.4 \quad (14), \text{ and}$$

$$0.8 \leq n \leq 1.2 \quad (15),$$

wherein the α-type sialon crystal is expressed by a composition formula:

$$Li_aEu_bSi_cAl_dO_eN_f \text{ (here, assuming } a+b+c+d+e+f=1),$$

wherein:

$$0.005 \leq b/(a+b) \leq 0.06 \quad (16),$$

and
  wherein the α-type sialon crystal emits the fluorescence with the peak in a wavelength region of from 550 nm to 575 nm upon irradiation of the excitation source.

(7) The phosphor according to any one of the above (1) to (6) wherein the excitation source can be an ultraviolet or visible light having wavelength that is at least 100 nm and does not exceed 500 nm.

(8) The phosphor according to any one of the above (1) to (8) wherein the fluorescence emitted upon irradiation of the excitation source has an emission color represented by (x, y) values in the CIE Chromaticity coordinate and satisfying the conditions:

$$0.2 \leq x \leq 0.5 \quad (17), \text{ and}$$

$$0.4 \leq y \leq 0.7 \quad (18).$$

(9) The phosphor according to the above (1) further comprising: an amorphous phase or another crystalline phase than the α-type sialon, wherein a content amount of the α-type sialon crystal is 10 mass % or more.

(10) The phosphor according to the above (9) wherein the content amount of the α-type sialon crystal is 50 mass % or more.

(11) The phosphor according to the above (9) or (10) wherein the amorphous phase or the other crystalline phase is inorganic substance having electronic conductivity.

(12) A method of manufacturing the phosphor recited in any one of the above (1) to (11) comprising: firing in a nitrogen atmosphere in a temperature range which is 1500 degree Celsius or higher and 2200 degree Celsius or lower a raw material mixture which is a mixture of metal compounds and can constitute a composition comprising: Li, A, Si, Al, O, and N (here, A being one or more kinds of elements selected from Mn, Ce, Pr, Nd, Sm, Eu, Tb, Dy, Er, Tm, and Yb, and the mixture being able to comprise a metal element M that can be solid solved in the α-type sialon and the M being one or more kinds of metal elements other than Li and the A element) by firing.

(13) The method of manufacturing the phosphor according to the above (12), wherein the mixture of metal compounds is a mixture of silicon nitride, aluminum nitride, lithium oxide or a lithium compound to become the lithium oxide by firing (an addition amount of the lithium compound being calculated by converting the equivalent amount of $Li_2O$), europium oxide or an europium compound to become the europium oxide by firing (an addition amount of the europium compound being calculated by converting the equivalent amount of EuO), wherein a mixture composition (mass ratio) is expressed by $gSi_3N_4 \cdot hAlN \cdot iLi_2O \cdot jEuO$ (here, assuming $g+h+i+j=1$), and wherein the parameters g, h, i, and j satisfy $$0.64 \leq g \leq 0.79 \quad (19),$$

$$0.16 \leq h \leq 0.26 \quad (20),$$

$$0.03 \leq i \leq 0.33 \quad (21), \text{ and}$$

$$0.002 \leq j \leq 0.06 \quad (22).$$

(14) The method of manufacturing the phosphor according to the above (12) or (13) wherein the nitrogen atmosphere is a gas atmosphere of a pressure range that is 0.1 MPa or higher and 100 MPa or lower.

(15) The method of manufacturing the phosphor according to any one of the above (12) to (14)

wherein the raw material mixture is in a state of power or aggregate, and wherein the raw material mixture is filled in a vessel with a bulk density of 40% or lower in a packing step and then the raw material mixture is fired in the firing step.

(16) The method of manufacturing the phosphor according to the above (15) wherein the vessel is made of boron nitride.

(17) The method of manufacturing the phosphor according to the above (15) or (16) wherein the raw material mixture comprises aggregate with a mean particle diameter of 500 μm or smaller.

(18) The method of manufacturing the phosphor according to any one of the above (12) to (17) wherein the firing step is conducted without applying any mechanical compressing force.

Here, the firing without applying any mechanical compressing force may for example include firing by a gas-pressure sintering method, but does not include the hot press, which apply a mechanical compressing force.

(19) The method of manufacturing the phosphor according to any one of the above (12) to (18) further comprising: adjusting particle sizes of synthesized phosphor powder by one of more methods selected from pulverizing, classifying, and acid treating so as to adjust a mean particle diameter equal to 50 nm or larger and equal to 20 μm or smaller.

(20) The method of manufacturing the phosphor according to any one of the above (12) to (19) further comprising: heat treating the phosphor at a temperature that is equal to 1000 degree Celsius or higher and the firing temperature or lower after the firing step.

Here, the phosphor after the firing step may include a phosphor body and phosphor powder having undergone the above-described firing step, a phosphor powder having undergone further a pulverizing step, and a phosphor powder having undergone a particle size adjustment step.

(21) The method of manufacturing the phosphor according to any one of the above (12) to (20) wherein an inorganic compound to produce a liquid phase at a temperature equal to or less than the firing temperature is added to the mixture of metal compounds, which is then fired in the firing step.

(22) The method of manufacturing the phosphor according to the above (21) wherein the inorganic compound to produce the liquid phase at the temperature equal to or less than the firing temperature comprises: one or more selected from fluoride, chloride, iodide, bromide, or phosphate of one or more elements selected from Li, Na, K, Mg, Ca, Sr, Ba, Al, and Eu.

(23) The method of manufacturing the phosphor according to the above (21) or (22) wherein the inorganic compound to produce the liquid phase at the temperature equal to or less than the firing temperature is lithium fluoride, calcium fluoride, or aluminum fluoride.

(24) The method of manufacturing the phosphor according to any one of the above (12) to (23), further comprising: washing a product after the firing step with a solvent comprising: water or acid aqueous solution so as to reduce contents of a glass phase, a second phase, or impurities.

(25) The method of manufacturing the phosphor according to the above (24) wherein the acid aqueous solution comprises sulfuric acid, hydrochloric acid, nitric acid, hydrofluoric acid, organic acid, or a combination thereof.

(26) The method of manufacturing the phosphor according to the above (24) or (25) wherein the acid aqueous solution comprises a mixture of hydrofluoric acid and sulfuric acid.

(27) A lighting apparatus comprising: an emission source and a phosphor wherein the phosphor comprises: at least the phosphor recited in any one of the above (1) to (11).

(28) The lighting apparatus according to the above (27) wherein the emission source is an inorganic EL device, an organic EL device, a laser diode (LD), or a white color light-emitting diode (LED) emitting a light of a wavelength of from 330 to 500 nm.

(29) The lighting apparatus according to the above (27) or (28)

wherein the emission source is the LED or LD emitting the light of the wavelength of 330 to 420 nm, the lighting apparatus comprising:

the phosphor recited in any one of claims 1 to 11;

a blue color phosphor having an emission peak at a wavelength of 450 nm to 500 nm upon irradiation of an excitation light of 330 to 420 nm; and a red color phosphor having an emission peak at a wavelength of 600 nm to 700 nm upon irradiation of the excitation light of 330 to 420 nm; and wherein a white light is emitted by mixing a blue light, a green light, and a red light.

(30) The lighting apparatus according to the above (27) or (28)

wherein the emission source is the LED or LD emitting the light of the wavelength of 430 to 480 nm, and wherein a white light is emitted by mixing a blue light of the excitation source and a yellow light of the phosphor recited in any one of the above (1) to (11).

(31) The lighting apparatus according to the above (27) or (28)
wherein the emission source is the LED or LD emitting the light of the wavelength of 430 to 480 nm, and
the lighting apparatus comprising:
the phosphor recited in any one of claims 1 to 11; and
an orange or red color phosphor having an emission peak at a wavelength of 580 nm to 700 nm upon irradiation of an excitation light of 430 to 480 nm; and
wherein a white light is emitted by mixing a blue light of the excitation source, a yellow light of the phosphor, and an orange-to-red light of the phosphor.

(32) The lighting apparatus according to the above (31) wherein the red color phosphor is Eu-activated $CaAlSiN_3$.

(33) The lighting apparatus according to the above (31) wherein the orange color phosphor is Eu-activated Ca-α-sialon.

(34) An image display device comprising: an excitation source and a phosphor wherein the phosphor comprises at least the phosphor recited in any one of the above (1) to (11).

(35) The image display device according to the above (34) wherein the excitation source is an electron beam, an electric field, a vacuum ultraviolet ray, or an ultraviolet ray.

(36) The image display device according to the above (34) or (35) wherein the image display device is a vacuum fluorescent display (VFD), a field emission display (FED), a plasma display panel (PDP), or a cathode ray tube (CRT).

The phosphor of the present invention is characterized by a high intensity and a small temperature fluctuation of the brightness since an inorganic compound is contained as a main component wherein the A element (Mn, Ce, Pr, Nd, Sm, Eu, Tb, Dy, Er, Tm, Yb) solid solves into the inorganic compound which comprises as a host α-type sialon crystal having a specific composition, into which Li solid solves. Further, the phosphor of a specific composition to which Eu or the like is added renders an emission of shorter wavelength than the conventional orange or yellow sialon phosphor so as to be superior as the yellow-green phosphor. Further, since the phosphor is chemically stable, the brightness does not deteriorate in particular even if the phosphor is exposed to the excitation source. A useful phosphor to be utilized in VFD, FED, PDP, CRT, white color LED, and so on is provided.

Figure 1:
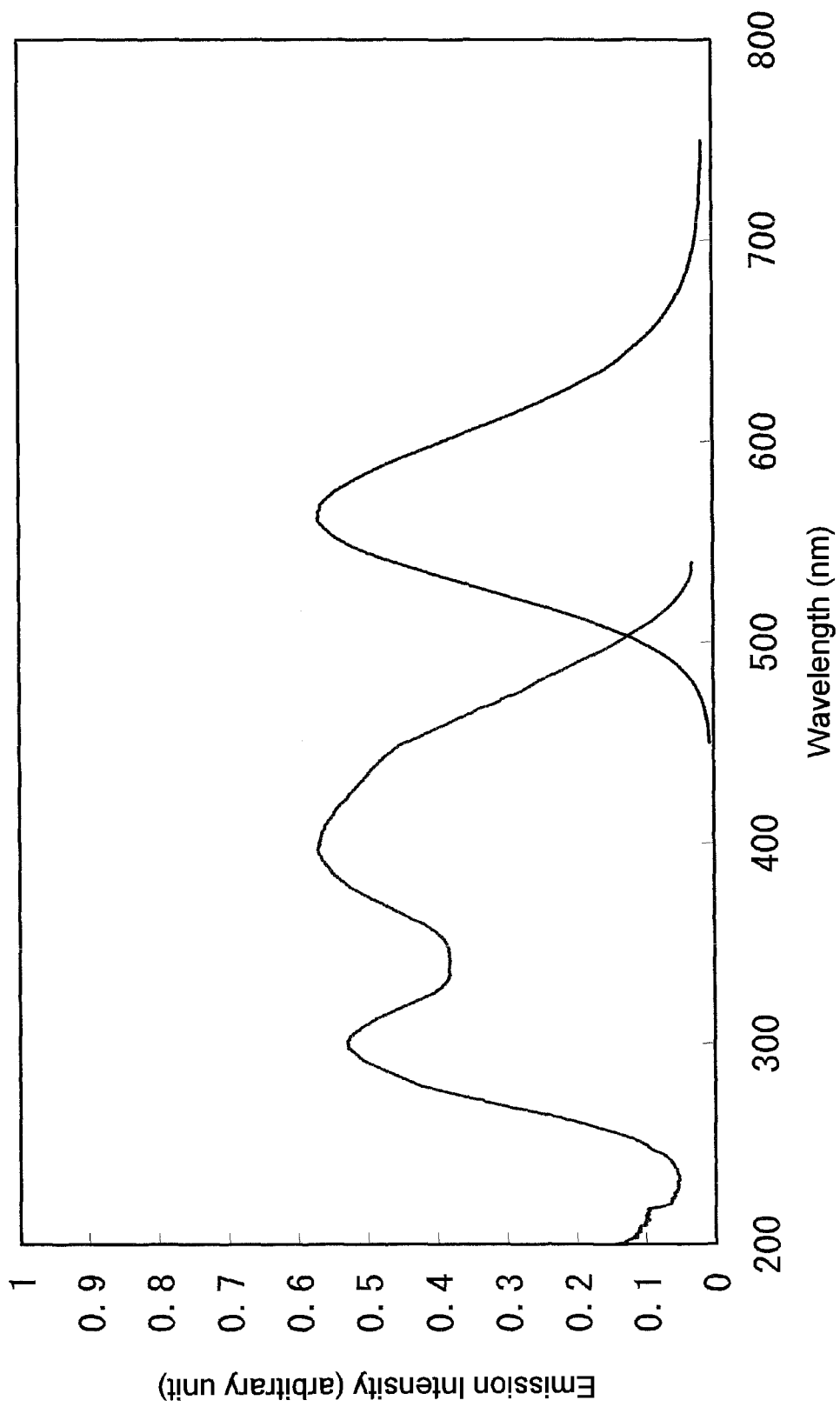
FIG. 1 is a drawing showing emission and excitation spectra of a phosphor (Example 14).

DESCRIPTION OF REFERENCE NUMERALS 1 bullet-type light-emitting diode lamp
2, 3 lead wire
4 light-emitting diode device
5 bonding wire
6, 8 resin
7 phosphor
21 tip-type white light-emitting diode lamp for mounting on a substrate
22, 23 lead wire
24 light-emitting diode device
25 bonding wire
26, 28 resin
27 phosphor
29 alumina ceramics substrate
30 side surface member
31 red color phosphor
32 green color phosphor
33 blue color phosphor
34, 35, 36 ultraviolet ray emission cell
37, 38, 39, 40 electrode
41, 42 dielectric layer
43 protective layer
44, 45 glass substrate

BEST MODE TO CARRY OUT THE INVENTION

Hereafter, the present invention is described in detail.

The phosphor of the present invention is a composition which comprises: at least Li; an activating element A; Si; Al; oxygen; and nitrogen, and includes an α-type sialon crystal as the main component. As a typical constituent element, A may be one or more kinds of elements selected from Mn, Ce, Pr, Nd, Sm, Eu, Tb, Dy, Er, Tm, and Yb. Further, the phosphor may include a metal element M, which is solid solved in the sialon lattice, other than Li and the A element as a constituent element as appropriate. As the metal element M, Na, K, Be, Mg, Ca, Sr, Ba, Sc, Y, La, Gd, Lu, and the like may be named. The A element functions as a luminescence center which emits fluorescence upon receiving the energy from an excitation source, and emission color differs depending on an added element. Therefore, an appropriate element for addition may be selected in order to obtain a desired color out of emission colors in a wavelength region extending from 400 nm to 700 nm according to the use. In particular, an Eu-doped phosphor shows a yellow-green emission having a peak in a wavelength region of from 530 nm to 580 nm, and hence is particularly suitable for building a white color LED in combination with a blue color LED. The element M solves into the sialon lattice to form the solid solution, contributes to stabilization of the crystal structure, and is selected from optically inert elements. In the present invention, Li plays a main role to stabilize the sialon lattice such that stable sialon may be formed without adding the element M, which can be if it is necessary to adjust the emission color.

An α-type sialon crystal comprising: Li, the A element, and the element M if necessary, is represented by a general formula:

$$(Li_{x1}, A_{x2}, M_{x3})(Si_{12-(m+x)}Al_{m+n})(O_nN_{16-n}).$$

In the present invention, the parameters: x1, x2, and x3 in the formula take values in ranges of:

$$1.2 \leq x1 \leq 2.4 \quad (1),$$

$$0.001 \leq x2 \leq 0.4 \quad (2), \text{ and}$$

$$0 \leq x3 \leq 1.0 \quad (3).$$

The parameter x1 represents the number of Li atoms which solve in the unit cell of sialon to form a solid solution. When x1 is smaller than 1.2, the brightness may not be so effectively enhanced by Li addition. And when x1 is larger than 2.4, crystalline phases other than the α-type sialon precipitates such that the reduction of the emission brightness may be caused. The parameter x2 represents the number of the A atoms as an activating element which solid solve in the sialon unit cell to form the solid solution. When x2 is smaller than 0.001, the brightness is low because the number of optically active ions is too small, and when x2 is larger than 0.4, concentration quenching may be caused by the interaction between the A atoms, thereby causing the reduction of the brightness. The parameter x3 represents the number of M atoms which solve in the sialon unit cell to form a solid solution. The value of x3 may be zero, that is, it is not necessary to add the element M. However, if it is necessary to adjust, for example, the emission color, the element M may be added in a range of x3 of 1 or less. When x3 exceeds 1, the brightness may not be so efficiently enhanced by Li addition or the brightness may be lowered.

Among the sialon compositions shown above, the compositions in which the parameters x1 and x3 are in the ranges of:

$1.6 \leq x1 \leq 2.4$ (4), and $0 \leq x3 \leq 0.01$ (5), are preferable since the emission brightness is particularly high. It is more preferable that the phosphor has a composition in which x3=0, that is, the element M is not substantially included.

It is preferable that the phosphor has a composition in which the parameters m and n of the compositional formula of the sialon are in the ranges of:

$1.4 \leq m \leq 2.6$ (6), and $0.1 \leq n \leq 2$ (7), since the emission brightness is particularly high.

The parameter m is a value determined so as to maintain the electrical neutrality when a metal element is introduced to form a solid solution, and a relation of m=δx (here, δ is the valence of the metal M) holds. Therefore, when Li, A and M are included, the value of m is determined by $m = \delta_{Li} \times x1 + \delta_A \times x2 + \delta_M \times x3$.

The parameter $\delta_{Li}$ is the valence of the Li$^{+1}$ ion, that is, $\delta_{Li}=1$. The parameter $\delta_A$ is the valence of the ion A and, for example, $\delta_{Eu}=2$ for Eu$^{2+}$. The parameter $\delta_M$ is the valence of the ion M and, for example, $\delta_{Ca}=2$ for Ca$^{2+}$, and $\delta_{Lu}=3$ for Lu$^{3+}$.

When the value of m is smaller than 1.4, the amount of the metal element forming a solid solution is small and it is difficult to stabilize the sialon crystal. Consequently, the brightness of the phosphor may be lowered. When the value of m is larger than 2.6, crystalline phases other than the sialon are easily formed and the brightness may be also lowered.

The parameter n is a value related to the amount of the substitution-type solid solution of oxygen into the α-type $Si_3N_4$ structure and represents the number of oxygen atoms contained in a unit cell. Here, since the total number of oxygen atoms and nitrogen atoms which are contained in the unit cell is 16, the number of the nitrogen atoms contained in the unit cell is 16−n.

When a value of n is smaller than 0.1, it is not easy to stabilize the sialon crystal because the solid solution amount of a metal element is small such that the brightness of the phosphor may be lowered. When the value of n is larger than 2, crystalline phases other than the α-type sialon tend to precipitate such that the reduction of the emission brightness may be caused.

When a starting material such as $Li_2O$, Li $CO_3$, or the like to become this compound during firing is used as the starting material, the number x1 of Li atoms are introduced into the crystal lattice such that the number 0.5×x1 of O atoms will be introduced. When EuO or a starting material to become this compound during firing is used, the number x2 of Eu atoms are introduced into the crystal lattice such that the number x2 of O atoms will be introduced. When $MO_y$ or a starting material to become this compound during firing is used, the number x3 of M atoms are introduced into the crystal lattice such that the number $0.5 \times \delta_M \times x3$ of O atoms will be introduced. The value of n is determined as the total of the above values.

When these oxides are used as the starting materials, the values of m and n are mutually interdependent. Hence the value of n corresponding to $1.4 \leq m \leq 2.6$ is $0.7 \leq n \leq 1.3$.

When the metal nitrides of Li, A, or the element M such as $Li_3N$ and EuN are used as the starting materials, a metal element can be introduced without introducing oxygen. Thus, the values m and n can be changed as independent parameters. When a small value of n is preferable in order to obtain desired light-emitting properties, the metal nitride of the element M, A, or Li may be used.

The value of n can be made larger by replacing part of AlN serving as an aluminum source of the starting material by $Al_2O_3$, or part of $Si_3N_4$ serving as a Si source by $SiO_2$.

One of the sialons of the present invention which yields a yellow-green phosphor having a high brightness and excellent temperature characteristics is an α-type sialon phosphor containing Li and Eu. The composition of the foregoing phosphor is shown by a compositional formula $Li_a Eu_b Si_c Al_d O_e N_f$ (wherein $a+b+c+d+e+f=1$), and satisfies the following conditions:

$0.043 \leq a \leq 0.078$ (8), $0.0002 \leq b \leq 0.008$ (9), $0.27 \leq c \leq 0.33$ (10), $0.08 \leq d \leq 0.12$ (11), $0.027 \leq e \leq 0.1$ (12), and $0.42 \leq f \leq 0.52$ (13).

The value of a represents the content of Li. When the value of a is smaller than 0.043, a stable α-type sialon is hard to form such that the brightness may be lowered. When the value of a is larger than 0.078, the proportion of crystalline phases other than the α-type sialon tends to increase such that the brightness may be lowered. The value of b represents the content of Eu. When the value of b is smaller than 0.0002, the concentration of light emitting ions tends to become low such that the brightness may be lowered. When the value of b is larger than 0.008, the concentration of the light-emitting ions tends to become high such that the concentration quenching may be caused by the interaction between the light-emitting ions, thereby possibly reducing the brightness. The value of c represents the content of Si. When the value of c is smaller than 0.27 or larger than 0.33, the proportion of crystalline phases other than the α-type sialon tends to become large such that the brightness may be lowered. The value of d represents the content of Al. When the value of d is smaller than 0.08 or larger than 0.1, the proportion of crystalline phases other than the α-type sialon tends to become large such that brightness may be lowered. The value of e represents the content of oxygen, and in this range of composition, particularly high brightness is obtained. The value of f represents the content of nitrogen, and in this range of composition, particularly high brightness is obtained.

The phosphor of the present invention emits fluorescence which has a peak in the wavelength region of from 400 nm to 700 nm when irradiated by an excitation source. The light of this wavelength region corresponds to respective colors of violet, blue, blue-green, green, yellow-green, yellow, orange and red. The wavelength is to be selected in accordance with the purpose of use, and a composition which emits the selected color is to be synthesized.

As an excitation source, a light (vacuum ultraviolet ray, ultraviolet ray, or visible light) having a wavelength region of 100 nm or longer and 500 nm or shorter, and a radiation ray such as an electron beam, an X-ray, and a neutron beam can be named. Further, the phosphor may also be utilized for excitation (inorganic EL device) in the electric field.

A phosphor of a specific composition among the α-type sialon phosphors including Li and Eu emits fluorescence which has a peak in a wavelength region of from 530 nm to 580 nm, and the color of the fluorescence emitted upon irradiation of the excitation source satisfies the following conditions:

$0.2 \leq x \leq 0.5$, and $0.4 \leq y \leq 0.7$, where (x, y) are the CIE color coordinates of the emission color. This is a yellow-green color phosphor and is especially suitable for a white LED produced by combining the phosphor with a blue LED.

Among the α-type sialon phosphors including Li and Eu, a phosphor having the parameters m and n in ranges of:

$1.8 \leq m \leq 2.4$, and $0.8 \leq n \leq 2$, is expressed by a compositional formula $Li_a Eu_b Si_c Al_d O_e N_f$ (wherein $a+b+c+d+e+f=1$) and satisfies the following condition:

$0.005 \leq b/(a+b) \leq 0.06$.

The phosphor has especially desirable light-emitting properties as yellow phosphors for the white LED since the phosphor emit the fluorescence having the peak in the wavelength region of from 550 nm to 575 nm upon irradiation of the excitation source.

When the phosphor of the present invention is used as powder, a preferred mean particle diameter is 0.1 μm or larger and 50 μm or smaller from the viewpoint of dispersibility to resin and the fluidity of the powder. In particular, a particle diameter of 5 μm or larger and 10 μm or smaller is excellently handleable. Further, the emission brightness is enhanced if the phosphor in a powder state comprises single crystal particles with the mean diameter of 5 μm or larger and 10 μm or smaller.

In order to obtain a phosphor with high emission brightness, the content of impurities included in the α-type sialon crystals is preferably reduced to the utmost. Since light emission is quenched if a large amount of impurity elements Fe, Co, or Ni is contained, it is desirable to select the raw material powder and control a synthesis process so that the total amount of these elements is 500 ppm or smaller.

In the present invention, it is desirable that the phosphor contains as much α-type sialon crystal of high purity as possible and it is even more desirable that the α-type sialon crystal comprises a single phase from the viewpoint of the fluorescence emission. However, it is possible for the phosphor to contain a mixture with another crystalline phase or an amorphous phase within a range where characteristics thereof are not lowered. In this case, it is desirable that the content of the α-type sialon crystals is 10 mass % or larger in order to obtain the high brightness thereof. More preferably, when the content is maintained at 50 mass % or higher, the brightness improves remarkably. In the present invention, as the range of the main component, it is preferable that the content of the α-type sialon crystal is at least 10 mass % or larger. The content of the α-type sialon crystal can be determined based on the multiphase analysis by the Rietveld method as the X-ray diffraction measurement is performed. In a simpler way, the content can be obtained from the ratios among the respective heights of the strongest lines of the α-type sialon crystal and the other crystals by utilizing the X-ray diffraction results.

It is possible to provide the electrical conductivity to the phosphor of the present invention by mixing inorganic substances having the electrical conductivity into the phosphor if the phosphor is applied to the field where the phosphor is excited by an electron beam. As the inorganic substance having the electrical conductivity, oxide, oxynitride, nitride, or a combination thereof of one or more kinds of elements selected from Zn, Al, Ga, In, and Sn may be named.

The phosphor of the present invention emits fluorescence of a specific color of the wavelength region of from 400 nm to 700 nm. If it is necessary to mix the specific color with other colors, it is possible to mix it with other inorganic phosphors which emit fluorescence of the other colors.

The phosphor of the present invention obtained as described above is characterized in that its excitation source ranges more widely from an electron beam, an X-ray, and an ultraviolet ray to a visible light as opposed to an ordinary oxide phosphor or the conventional sialon phosphor and that the phosphor of the present invention emits the fluorescence of the wavelength region of from 400 nm to 700 nm and, in particular, the fluorescence of a yellow-green color, if it has a specific composition, of the wavelength region of from 530 nm to 585 nm, which may be the yellow-green color expressed by (x, y) in the CIE Chromaticity coordinate where x is at least 0.2 and x does not exceed 0.5 and where y is at least 0.4 and does not exceed 0.7. By utilizing the aforementioned light-emitting properties, the phosphor of the present invention is preferably applied to the lighting apparatus and the image display device. In addition, the phosphor of the present invention shows only a small fluctuation in the emission brightness as the temperature changes and demonstrates an excellent long-term stability in an oxidizing atmosphere and hydric environment.

Although the method of manufacturing the phosphor of the present invention is not prescribed, a phosphor having high brightness can be manufactured by the following method.

The high-brightness phosphor is obtained by firing a raw material mixture of metal compounds that can constitute a composition comprising: Li, A, Si, Al, O, and N (here, A is one or more kinds of elements selected from Mn, Ce, Pr, Nd, Sm, Eu, Tb, Dy, Er, Tm, and Yb, and the metal element M, if necessary, that can be solid solved in the α-type sialon) in a nitrogen atmosphere in a temperature range that is 1500° C. or higher and 2200° C. or lower.

When the phosphor including Li, Eu, Si, Al, O, and N is synthesized, it is preferable to prepare as the starting material a mixture of silicon nitride, aluminum nitride, lithium oxide or a compound to become lithium oxide by firing (an addition amount of the compound is calculated by converting the equivalent amount of $Li_2O$), and europium oxide or a compound to become europium oxide by firing (an addition amount of the compound is calculated by converting the equivalent amount of EuO).

In such a case, the mixture amount (mass ratio) of raw material powders is expressed by $gSi_3N_4 \cdot hAlN \cdot iLi_2O \cdot jEuO$ ($g+h+i+j=1$).

A phosphor with a high brightness is obtained by bringing the parameters g, h, i, and j into the following ranges:

$$0.64 \leq g \leq 0.79 \quad (16),$$

$$0.16 \leq h \leq 0.26 \quad (17),$$

$$0.03 \leq i \leq 0.33 \quad (18), \text{ and}$$

$$0.002 \leq j \leq 0.06 \quad (19).$$

Since it is likely to obtain a stable α-type sialon and a phosphor of high brightness, it is preferable that the firing is conducted in a nitrogen atmosphere of a pressure range of 0.1 MPa or higher and 100 MPa or lower. It is likely that silicon nitride as a raw material is decomposed at a high firing temperature when the gas pressure is less than 0.1 MPa. And the gas pressure higher than 100 MPa leads high cost such that it is not preferable in view of the industrial productivity.

The above-mentioned mixed powder of metal compounds may be fired in a state where the packing fraction is kept at a bulk density of 40% or lower. The bulk density refers to the volume packing fraction of powder and is a value given by dividing the ratio of mass of the powder filled in a certain vessel to the volumetric capacity of the vessel by the theoretical density of the metal compounds. Since the reactivity of a boron nitride sintered compact with the metal compounds is low, the boron nitride sintered compact is suitable for the vessel.

The reason why the firing process is conducted as the bulk density is kept to be 40% or lower is that it is readily to synthesize crystals with a small amount of surface defects since contacts between crystals become less as the crystals grow with reaction products if the firing process is conducted in a state where more free space is provided around the raw material powder.

Next, the phosphor is synthesized by firing the thus-obtained mixture of the metal compounds in an inert atmosphere containing nitrogen in a temperature range of 1200° C. or higher and 2200° C. or lower. Since the firing temperature is high and the firing atmosphere is an inert atmosphere containing nitrogen, an electric furnace of a metal resistance heating type or a graphite resistance heating type, in which a high temperature member of the furnace made of carbon is used, is suitable. As the firing method, a sintering method such as a pressureless sintering method or a gas-pressure sintering method in which no mechanical pressure is applied from the outside is preferable, but not a hot-press method, when the powder is directly synthesized since it is possible to conduct the firing as the bulk density is kept high in such a method.

When a powder aggregate obtained by the firing is firmly solidified, the powder aggregate is milled by a pulverizer usually used in the industry such as a ball mill and a jet mill. The milling is made until a mean particle diameter of 50 μm or smaller is attained. The mean particle diameter of from 0.1 μm to 5 μm is particularly preferable. If the mean particle diameter exceeds 50 μm, the fluidity of the powder and the dispersibility of the powder to resin tend to be inferior. Consequently, when a light emitting device is made by combining a light-emitting element, the emission intensity tends to become nonuniform depending on a portion of the element. If the mean particle diameter becomes 0.1 μm or smaller, the number of defects on the phosphor powder surface increases such that the emission intensity is lowered depending on the composition of the phosphor.

Here, in this specification, the mean particle diameter is defined as follows. In the measurement by the sedimentation method, the particle diameter is defined as a diameter of an equivalent sphere having the same sedimentation rate, and in the laser scattering method, it is defined as a diameter of an equivalent sphere having the same scattering characteristics. Further, the distribution of particle diameters is called a particle size (particle diameter) distribution. In the particle diameter distribution, a specified particle diameter is defined as a mean particle diameter D50 when the total mass of powder particles having diameters larger than the specified particle diameter is 50% of the total mass of the entire powder body. These definition and term are well known to the one skilled in the art and are described in various documents such as JIS Z 8901 "Powder Body for Test and Particle for Test" and the first chapter of "Basic Physical Properties of Powder" edited by The Society of Powder Technology, Japan (ISBN4-526-05544-1). In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As to a means for determining the mean particle diameter, various kinds of means have been developed and the development is still being performed such that the value measured by a newly developed means may differ slightly. However, it should be understood that the meaning and significance of the mean particle diameter itself is definite, and the means for measuring the mean particle diameter is not necessarily limited to the above-mentioned means.

If the phosphor powder after firing, the phosphor powder after milling treatment, or the phosphor powder after particle size adjustment is heat-treated in a temperature range of 1000° C. or higher and equal to or lower than the firing temperature, the defects introduced on the surface at the time of milling and the like decrease such that the brightness is improved.

By washing the product with water or a solvent constituted of an aqueous solution of an acid after the firing process, the content of a glass phase, a secondary phase, or an impurity phase contained in the product can be reduced, and the brightness is enhanced. In this case, the acid can be selected from one kind of substance or a mixture of sulfuric acid, hydrochloric acid, nitric acid, hydrofluoric acid, and organic acid. In particular, a mixture of hydrofluoric acid and sulfuric acid shows a pronounced effect on removing impurities.

As explained above, since the phosphor of the present invention shows higher brightness than the conventional sialon phosphor and smaller decline of the brightness of the phosphor when the phosphor is exposed to the excitation source, the phosphor is suitable for a VFD, an FED, a PDP, a CRT, a white color LED, and the like and, in particular, is suitable for the white color LED if it is combined with a blue color LED.

The lighting apparatus of the present invention comprises at least a light source and the phosphor of the present invention to be used therein. The lighting apparatus includes an LED lighting apparatus, an electroluminescence lighting apparatus, a fluorescent lamp, and the like. The LED lighting apparatus can be manufactured using the phosphor of the present invention by a publicly known method which is described in the Japanese Patent Laid-open Publication No. H05-152609, Japanese Patent Laid-open Publication No. H07-99345, Japanese Patent No. 2927279, and the like. In this case, the light source is preferably what emits a light of a wavelength region of from 330 to 500 nm. In particular, an LED light-emitting device emitting an ultraviolet (or violet) ray of a wavelength region of from 330 to 420 nm, or an LED light-emitting device emitting a blue light in a wavelength region of from 420 to 480 nm is especially preferred.

Such LED light-emitting devices include a nitride semiconductor such as GaN or InGaN, which can be a light source emitting a light of a predetermined wavelength by adjusting the composition.

In addition to the method of applying the phosphor of the present invention alone to the lighting apparatus, the lighting apparatus which emits a light of a desired color can be constructed by using another phosphor having other light-emitting properties together with the phosphor of the present invention. As an example of the above-mentioned lighting apparatus, there is a lighting apparatus which emits a white light produced by mixing the blue light, the green light, and the red light by utilizing an ultraviolet LED light-emitting device emitting a light of 330 to 420 nm, a blue color phosphor which is excited by the light of this wavelength region so as to emit a light of the wavelength region which is 450 nm or longer and 500 nm or shorter, the yellow-green color phosphor of the present invention, and a red color phosphor which emits a light of the wavelength region of from 600 nm to 700 nm as it is excited by an excitation light of 330 to 420 nm. As such a blue color phosphor and a red color phosphor, $BaMgAl_{10}O_{17}$:Eu and Eu-activated $CaAlSiN_3$ can be mentioned, respectively.

As another method, an LED light-emitting device which emits a blue light of a wavelength region of from 430 to 480 nm and the phosphor of the present invention may be combined. In this configuration, there is a lighting apparatus which emits a white light. When the blue light emitted by the LED is irradiated onto the phosphor, a yellow light is emitted such that this yellow light is mixed with the blue light of the LED itself so as to make the white light.

In another way, there is a lighting apparatus which emits a white light. An LED light-emitting device which emits a blue light of the wavelength region of from 430 to 480 nm, the phosphor of the present invention, and an orange or red color phosphor which shows a light emission peak in the wavelength region of from 580 nm to 700 nm by the excitation light of the wavelength region of from 430 to 480 nm are used such that the blue light of the excitation light source, the yellow light of the phosphor, and the orange or red light of the orange or red color phosphor are mixed so as to produce the white light. As the red color phosphor and the orange phosphor, Eu-activated $CaAlSiN_3$ and Eu-activated Ca-α-sialon can be mentioned, respectively.

The image display device of the present invention comprises at least an excitation source and the phosphor of the present invention and includes a vacuum fluorescent display (VFD), a field emission display (FED), a plasma display panel (PDP), a cathode-ray tube (CRT), and the like. It was confirmed that the phosphor of the present invention emits a light by the excitation light of a vacuum ultraviolet ray of wavelength of from 100 to 190 nm, an ultraviolet ray of wavelength of from 190 to 380 nm, an electron beam, or the like. The above-mentioned image display devices can be constructed by combining the excitation source and the phosphor of the present invention.

EXAMPLE

In the following, the present invention is described in more detail with reference to examples as described below. However, these examples are disclosed as a help for easy understanding of the present invention and the present invention is not limited to these examples.

Examples 1-30

In the α-type sialon including Li and Eu, compositions having values of design parameters x1, x2, m, and n (Table 1); and values of a, b, c, d, e, and f in a $Li_aEu_bSi_cAl_dO_eN_f$ material composition (Table 2) were examined. Here, in the present examples, it is assumed x3=0. Based on the design, silicon nitride powder, aluminum nitride powder, lithium carbonate powder, and europium oxide powder were mixed according to the compositions as shown in Table 4 in order to obtain the design compositions having values of g, h, i, and j of $gSi_3N_4 \cdot hAlN \cdot iLi_2O \cdot jEuO$ mixture compositions (Table 3). Raw material powders used to obtain the mixtures as summarized in Table 4 are: silicon nitride powder having a particle size of a specific surface area of 11.2 m$^2$/g, containing 1.29 wt % of oxygen, and containing 95% α-type silicon nitride (SN-E10 grade manufactured by Ube Industries, Ltd.); aluminum nitride powder having a particle size of a specific surface area of 3.3 m$^2$/g, containing 0.85 wt % of oxygen (F grade manufactured by Tokuyama Corporation); lithium carbonate powder (Li $CO_3$; manufactured by Kojundo Chemical Laboratory Co., Ltd.); and europium oxide ($Eu_2O_3$; purity 99.9%, manufactured by Shin-Etsu Chemical Co., Ltd.). These kinds of powders were weighed so as to obtain each of the mixture compositions of Table 4, and mixed in the air for 10 minutes by using an agate pestle and an agate mortar. Then, each of the thus-obtained mixtures was sifted through a sieve of 500 μm and allowed to fall naturally into a boron nitride crucible such that the powder was filled in the crucible. The bulk densities of the powders were about 25% to 30%.

The parameters of the design compositions of examples 1 to 30 and a comparative example are shown in Table 1, the parameters of the design compositions of examples 1 to 30 and a comparative example are shown in Table 2, the parameters of the mixture compositions of examples 1 to 30 and a comparative example are shown in Table 3, and the mixture compositions of examples 1 to 30 and a comparative example are shown in Table 4.

TABLE 1

| Example | a/(a + b) | x1 | x2 | m | n |
|---|---|---|---|---|---|
| 1 | 0.005 | 1.584 | 0.008 | 1.600 | 0.800 |
| 2 | 0.010 | 1.568 | 0.016 | 1.600 | 0.800 |
| 3 | 0.020 | 1.536 | 0.032 | 1.600 | 0.800 |
| 4 | 0.040 | 1.472 | 0.064 | 1.600 | 0.800 |
| 5 | 0.060 | 1.408 | 0.096 | 1.600 | 0.800 |
| 6 | 0.100 | 1.280 | 0.160 | 1.600 | 0.800 |
| 7 | 0.005 | 1.782 | 0.009 | 1.800 | 0.900 |
| 8 | 0.010 | 1.764 | 0.018 | 1.800 | 0.900 |
| 9 | 0.020 | 1.728 | 0.036 | 1.800 | 0.900 |
| 10 | 0.040 | 1.656 | 0.072 | 1.800 | 0.900 |
| 11 | 0.060 | 1.584 | 0.108 | 1.800 | 0.900 |
| 12 | 0.100 | 1.440 | 0.180 | 1.800 | 0.900 |
| 13 | 0.005 | 1.980 | 0.010 | 2.000 | 1.000 |
| 14 | 0.010 | 1.960 | 0.020 | 2.000 | 1.000 |
| 15 | 0.020 | 1.920 | 0.040 | 2.000 | 1.000 |
| 16 | 0.040 | 1.840 | 0.080 | 2.000 | 1.000 |
| 17 | 0.060 | 1.760 | 0.120 | 2.000 | 1.000 |
| 18 | 0.100 | 1.600 | 0.200 | 2.000 | 1.000 |
| 19 | 0.005 | 2.178 | 0.011 | 2.200 | 1.100 |
| 20 | 0.010 | 2.156 | 0.022 | 2.200 | 1.100 |
| 21 | 0.020 | 2.112 | 0.044 | 2.200 | 1.100 |
| 22 | 0.040 | 2.024 | 0.088 | 2.200 | 1.100 |
| 23 | 0.060 | 1.936 | 0.132 | 2.200 | 1.100 |
| 24 | 0.100 | 1.760 | 0.220 | 2.200 | 1.100 |
| 25 | 0.005 | 2.376 | 0.012 | 2.400 | 1.200 |
| 26 | 0.010 | 2.352 | 0.024 | 2.400 | 1.200 |
| 27 | 0.020 | 2.304 | 0.048 | 2.400 | 1.200 |
| 28 | 0.040 | 2.208 | 0.096 | 2.400 | 1.200 |
| 28 | 0.060 | 2.112 | 0.144 | 2.400 | 1.200 |
| 30 | 0.100 | 1.920 | 0.240 | 2.400 | 1.200 |
| Comparative example | 0.050 | 0.810 | 0.045 | 0.900 | 0.450 |

TABLE 2

| Example | Li a | Eu b | Si c | Al d | O e | N f |
|---|---|---|---|---|---|---|
| 1 | 5.353 | 0.027 | 32.441 | 8.110 | 2.703 | 51.365 |
| 2 | 5.300 | 0.054 | 32.450 | 8.112 | 2.704 | 51.379 |
| 3 | 5.195 | 0.108 | 32.468 | 8.117 | 2.706 | 51.407 |
| 4 | 4.984 | 0.217 | 32.503 | 8.126 | 2.709 | 51.463 |
| 5 | 4.772 | 0.325 | 32.538 | 8.134 | 2.711 | 51.518 |
| 6 | 4.348 | 0.543 | 32.609 | 8.152 | 2.717 | 51.630 |
| 7 | 5.982 | 0.030 | 31.217 | 9.063 | 3.021 | 50.686 |
| 8 | 5.923 | 0.060 | 31.227 | 9.066 | 3.022 | 50.702 |
| 9 | 5.806 | 0.121 | 31.246 | 9.071 | 3.024 | 50.732 |
| 10 | 5.571 | 0.242 | 31.284 | 9.082 | 3.027 | 50.794 |
| 11 | 5.335 | 0.364 | 31.322 | 9.093 | 3.031 | 50.855 |
| 12 | 4.862 | 0.608 | 31.398 | 9.115 | 3.038 | 50.979 |
| 13 | 6.602 | 0.033 | 30.010 | 10.003 | 3.334 | 50.017 |
| 14 | 6.538 | 0.067 | 30.020 | 10.007 | 3.336 | 50.033 |
| 15 | 6.409 | 0.134 | 30.040 | 10.013 | 3.338 | 50.067 |
| 16 | 6.150 | 0.267 | 30.080 | 10.027 | 3.342 | 50.134 |
| 17 | 5.890 | 0.402 | 30.120 | 10.040 | 3.347 | 50.201 |
| 18 | 5.369 | 0.671 | 30.201 | 10.067 | 3.356 | 50.336 |
| 19 | 7.215 | 0.036 | 28.818 | 10.931 | 3.644 | 49.356 |
| 20 | 7.144 | 0.073 | 28.829 | 10.935 | 3.645 | 49.374 |
| 21 | 7.004 | 0.146 | 28.850 | 10.943 | 3.648 | 49.410 |
| 22 | 6.722 | 0.292 | 28.892 | 10.959 | 3.653 | 49.482 |
| 23 | 6.439 | 0.439 | 28.934 | 10.975 | 3.658 | 49.554 |
| 24 | 5.871 | 0.734 | 29.019 | 11.007 | 3.669 | 49.700 |
| 25 | 7.819 | 0.039 | 27.642 | 11.847 | 3.949 | 48.703 |
| 26 | 7.743 | 0.079 | 27.653 | 11.851 | 3.950 | 48.723 |
| 27 | 7.591 | 0.158 | 27.675 | 11.861 | 3.954 | 48.761 |
| 28 | 7.286 | 0.317 | 27.719 | 11.880 | 3.960 | 48.838 |
| 29 | 6.980 | 0.476 | 27.763 | 11.898 | 3.966 | 48.916 |
| 30 | 6.366 | 0.796 | 27.851 | 11.936 | 3.979 | 49.072 |
| Comparative example | 2.807 | 0.156 | 36.909 | 4.679 | 1.560 | 53.890 |

TABLE 3

| Example | Si3N4 g | AlN h | Li2O i | EuO j |
|---|---|---|---|---|
| 1 | 50.000 | 37.500 | 12.375 | 0.125 |
| 2 | 50.000 | 37.500 | 12.250 | 0.250 |
| 3 | 50.000 | 37.500 | 12.000 | 0.500 |
| 4 | 50.000 | 37.500 | 11.500 | 1.000 |
| 5 | 50.000 | 37.500 | 11.000 | 1.500 |
| 6 | 50.000 | 37.500 | 10.000 | 2.500 |
| 7 | 46.269 | 40.299 | 13.299 | 0.134 |
| 8 | 46.269 | 40.299 | 13.164 | 0.269 |
| 9 | 46.269 | 40.299 | 12.896 | 0.537 |
| 10 | 46.269 | 40.299 | 12.358 | 1.075 |
| 11 | 46.269 | 40.299 | 11.821 | 1.612 |
| 12 | 46.269 | 40.299 | 10.746 | 2.687 |
| 13 | 42.857 | 42.857 | 14.143 | 0.143 |
| 14 | 42.857 | 42.857 | 14.000 | 0.286 |
| 15 | 42.857 | 42.857 | 13.714 | 0.571 |
| 16 | 42.857 | 42.857 | 13.143 | 1.143 |
| 17 | 42.857 | 42.857 | 12.571 | 1.714 |
| 18 | 42.857 | 42.857 | 11.429 | 2.857 |
| 19 | 39.726 | 45.205 | 14.918 | 0.151 |
| 20 | 39.726 | 45.205 | 14.767 | 0.301 |
| 21 | 39.726 | 45.205 | 14.466 | 0.603 |
| 22 | 39.726 | 45.205 | 13.863 | 1.205 |
| 23 | 39.726 | 45.205 | 13.260 | 1.808 |
| 24 | 39.726 | 45.205 | 12.055 | 3.014 |
| 25 | 36.842 | 47.368 | 15.632 | 0.158 |
| 26 | 36.842 | 47.368 | 15.474 | 0.316 |
| 27 | 36.842 | 47.368 | 15.158 | 0.632 |
| 28 | 36.842 | 47.368 | 14.526 | 1.263 |
| 29 | 36.842 | 47.368 | 13.895 | 1.895 |
| 30 | 36.842 | 47.368 | 12.632 | 3.158 |
| Comparative example | 66.355 | 25.234 | 7.570 | 0.841 |

TABLE 4

| Example | Si3N4 | AlN | Li2CO3 | Eu2O3 |
|---|---|---|---|---|
| 1 | 73.927 | 16.202 | 9.640 | 0.230 |
| 2 | 73.828 | 16.180 | 9.530 | 0.460 |
| 3 | 73.631 | 16.137 | 9.310 | 0.920 |
| 4 | 73.238 | 16.051 | 8.870 | 1.840 |
| 5 | 72.850 | 15.966 | 8.440 | 2.740 |
| 6 | 72.085 | 15.799 | 7.600 | 4.520 |
| 7 | 70.944 | 18.056 | 10.740 | 0.260 |
| 8 | 70.839 | 18.029 | 10.620 | 0.520 |
| 9 | 70.626 | 17.975 | 10.370 | 1.030 |
| 10 | 70.207 | 17.868 | 9.880 | 2.050 |
| 11 | 69.792 | 17.763 | 9.390 | 3.050 |
| 12 | 68.980 | 17.556 | 8.440 | 5.020 |
| 13 | 68.017 | 19.876 | 11.820 | 0.280 |
| 14 | 67.905 | 19.843 | 11.680 | 0.570 |
| 15 | 67.681 | 19.777 | 11.410 | 1.130 |
| 16 | 67.239 | 19.649 | 10.860 | 2.250 |
| 17 | 66.804 | 19.521 | 10.320 | 3.350 |
| 18 | 65.949 | 19.271 | 9.260 | 5.520 |
| 19 | 65.142 | 21.662 | 12.890 | 0.310 |
| 20 | 65.025 | 21.622 | 12.730 | 0.620 |
| 21 | 64.793 | 21.546 | 12.430 | 1.230 |
| 22 | 64.333 | 21.392 | 11.830 | 2.450 |
| 23 | 63.878 | 21.241 | 11.230 | 3.650 |
| 24 | 62.991 | 20.946 | 10.070 | 5.990 |
| 25 | 62.321 | 23.414 | 13.930 | 0.340 |
| 26 | 62.200 | 23.369 | 13.760 | 0.670 |
| 27 | 61.960 | 23.278 | 13.430 | 1.330 |
| 28 | 61.485 | 23.100 | 12.770 | 2.640 |
| 29 | 61.017 | 22.924 | 12.120 | 3.940 |
| 30 | 60.102 | 22.581 | 10.850 | 6.460 |
| Comparative example | 84.238 | 9.361 | 5.060 | 1.340 |

The crucible containing the mixed powder was placed in an electric furnace of a graphite resistance heating type. In the operation of firing, first a firing atmosphere was made in a vacuum by a diffusion pump and the mixed powder contained in the crucible was heated from the room temperature to 800° C. at a rate of 500° C. per hour. Nitrogen gas having 99.999 volume % purity was introduced at 800° C. to raise the pressure of the atmosphere up to 1 MPa and then the temperature was further raised up to any one of 1550° C., 1600° C., and 1650° C. at a rate of 500° C. per hour. Then, the temperature was kept for 8 hours.

Subsequently, the synthesized compounds were ground by using an agate mortar, and a powder X-ray diffraction measurement was conducted using the Cu $K_\alpha$ ray. Then, none of unreacted $Si_3N_4$, AlN, $Li_2O$, or $Eu_2O_3$ was detected such that it was confirmed that all examples contained 80% or more of α-type sialon.

After the firing process, the resultant fired product was ground by hand using a mortar and a crucible made of sintered silicon nitride after being crushed coarsely and then sifted through a 30 μm-mesh sieve. The mean particle diameter of each ground product ranged from 5 to 8 μm.

As a result of irradiating a light of wavelength of 365 nm onto these powder samples using a lamp which emits the light, it was confirmed that these powder samples emit lights of yellow-green color to yellow color. The results of measurement of emission spectra and excitation spectra of these powder samples with a spectrophotofluorometer are summarized in Table 5. In all examples, phosphors which were efficiently excited by an ultraviolet ray, a violet light, and a blue light of a wavelength region of from 300 nm to 450 nm and emitted yellow-green fluorescence having a peak in the wavelength region of from 530 nm to 585 nm. Here, since the counted values vary depending on the measuring instruments and conditions, the unit of the values is an arbitrary unit. That is, comparisons thereof can be made only within the present examples and comparative example measured in the same conditions. The peak wavelengths and peak intensities of the excitation and emission spectra of Examples 1 to 30 and Comparative example are shown in Tables 5.

TABLE 5

| | Firing at 1550° c. | | | Firing at 1600° c. | | | Firing at 1650° c. | | |
|---|---|---|---|---|---|---|---|---|---|
| Example | Emission Intensity (arb. unit) | Emission Wavelength (nm) | Excitation Wavelength (nm) | Emission Intensity (arb. unit) | Emission Wavelength (nm) | Excitation Wavelength (nm) | Emission Intensity (arb. unit) | Emission Wavelength (nm) | Excitation Wavelength (nm) |
| 1 | 0.13 | 551 | 304 | 0.26 | 559 | 299 | 0.28 | 559 | 300 |
| 2 | 0.2 | 561 | 300 | 0.34 | 561 | 397 | 0.33 | 562 | 401 |
| 3 | 0.39 | 564 | 402 | 0.4 | 568 | 411 | 0.34 | 566 | 412 |
| 4 | 0.43 | 568 | 408 | 0.49 | 568 | 427 | 0.39 | 571 | 436 |
| 5 | 0.46 | 571 | 415 | 0.5 | 572 | 437 | 0.44 | 573 | 441 |
| 6 | 0.4 | 571 | 419 | 0.55 | 575 | 439 | 0.55 | 576 | 443 |
| 7 | 0.01 | 471 | 310 | 0.03 | 476 | 304 | 0.04 | 545 | 302 |
| 8 | 0.2 | 530 | 300 | 0.46 | 562 | 396 | 0.47 | 563 | 402 |
| 9 | 0.39 | 567 | 405 | 0.5 | 568 | 418 | 0.41 | 567 | 411 |
| 10 | 0.43 | 569 | 411 | 0.62 | 568 | 438 | 0.57 | 570 | 438 |
| 11 | 0.46 | 570 | 419 | 0.62 | 574 | 442 | 0.49 | 573 | 438 |
| 12 | 0.39 | 572 | 424 | 0.51 | 575 | 443 | 0.6 | 577 | 449 |
| 13 | 0.14 | 558 | 299 | 0.31 | 560 | 301 | 0.44 | 559 | 300 |
| 14 | 0.25 | 563 | 299 | 0.49 | 566 | 395 | 0.57 | 562 | 397 |
| 15 | 0.47 | 568 | 403 | 0.56 | 566 | 406 | 0.52 | 569 | 408 |
| 16 | 0.5 | 569 | 419 | 0.53 | 571 | 418 | 0.61 | 571 | 439 |
| 17 | 0.48 | 571 | 425 | 0.57 | 574 | 441 | 0.56 | 574 | 449 |
| 18 | 0.36 | 568 | 441 | 0.46 | 572 | 440 | 0.64 | 576 | 449 |
| 19 | 0.14 | 559 | 299 | 0.3 | 561 | 301 | 0.47 | 561 | 395 |
| 20 | 0.28 | 564 | 300 | 0.46 | 568 | 397 | 0.46 | 562 | 394 |
| 21 | 0.39 | 568 | 408 | 0.53 | 568 | 406 | 0.49 | 568 | 408 |
| 22 | 0.46 | 572 | 425 | 0.46 | 572 | 436 | 0.47 | 572 | 437 |
| 23 | 0.38 | 571 | 418 | 0.48 | 571 | 438 | 0.5 | 574 | 449 |
| 24 | 0.33 | 567 | 417 | 0.33 | 575 | 449 | 0.42 | 575 | 449 |
| 25 | 0.03 | 495 | 306 | 0.06 | 538 | 301 | 0.11 | 549 | 300 |
| 26 | 0.28 | 564 | 299 | 0.5 | 568 | 397 | 0.53 | 567 | 397 |
| 27 | 0.41 | 568 | 404 | 0.49 | 568 | 410 | 0.49 | 568 | 408 |
| 28 | 0.43 | 573 | 419 | 0.36 | 550 | 436 | 0.43 | 573 | 439 |
| 29 | 0.35 | 568 | 418 | 0.49 | 573 | 444 | 0.56 | 572 | 449 |
| 30 | 0.32 | 568 | 442 | 0.44 | 573 | 448 | 0.47 | 576 | 449 |

The phosphor which was obtained by firing the composition of example 14 at 1650° C. has an emission intensity of 0.57, a peak wavelength of the excitation spectrum at 397 nm, and a peak wavelength of the emission spectrum at 562 nm. The emission- and excitation spectra of this phosphor are shown in FIG. 1. This phosphor can be excited by an excitation light of a broad region extending from 250 nm to 500 nm. In particular, the phosphor is characterized in that the excitation intensity is especially high at the wavelength of a 405 nm violet LED or the wavelength of a 450 nm blue LED. The color coordinates of the fluorescence were x=0.377 and y=0.365.

Comparative Example

In order to synthesize Eu-activated Li-α-sialon of

Figure 2:
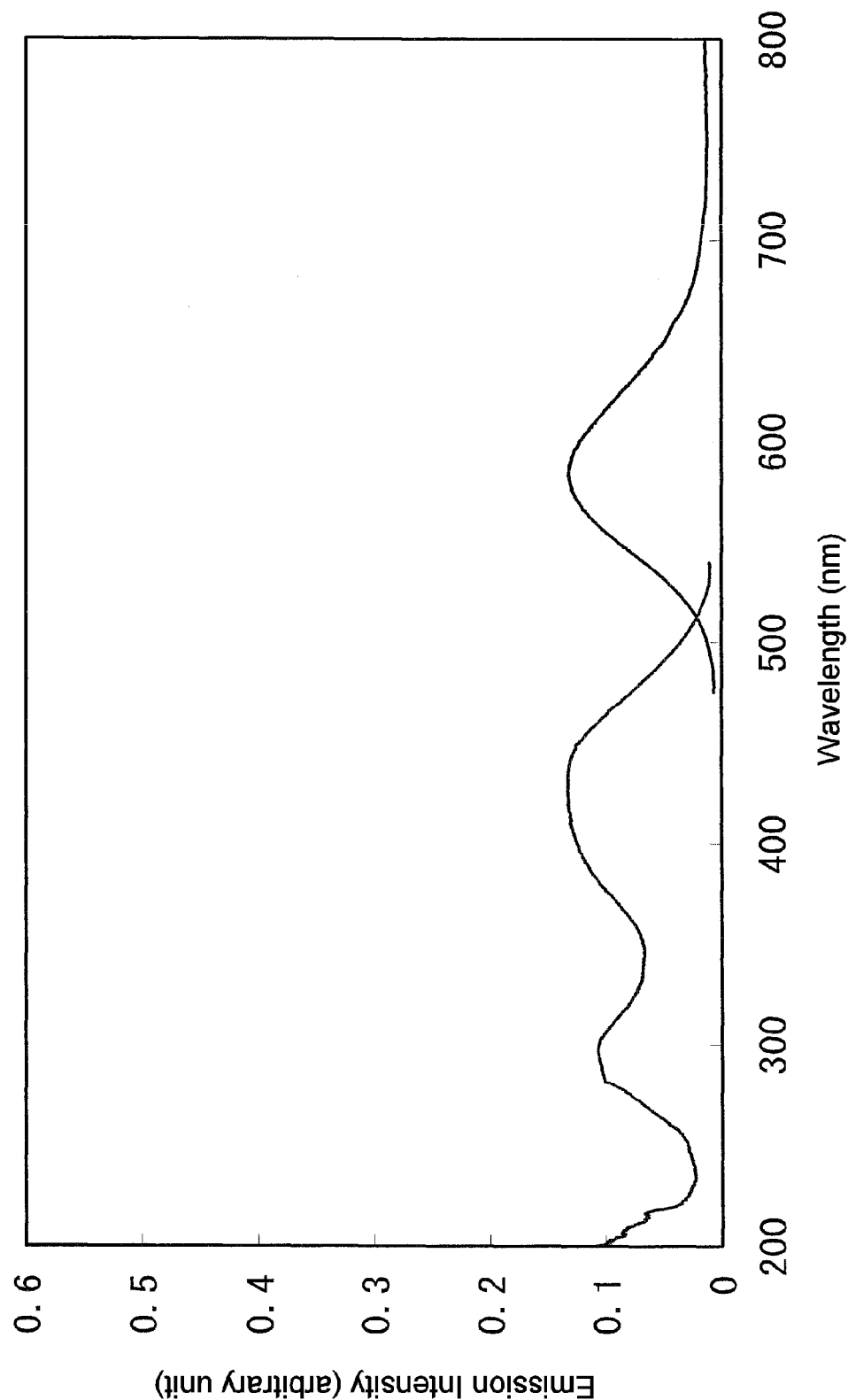
FIG. 2 is a drawing showing emission and excitation spectra of a phosphor (Comparative example).

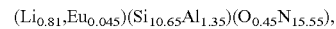

in which the parameters are as follows: x1=0.81, x2=0.045, m=0.9, and n=0.45, from the same raw material powders as used in the examples, raw materials were mixed according to the mixture composition as shown in Tables 3 and 4 in accordance with the design composition as shown in Tables 1 and 2 and phosphor was synthesized in a similar process as described in the examples. According to the X-ray diffraction measurement, α-type sialon was detected in the synthesized compound, but no other crystalline phases were detected. Emission and excitation spectra of the powder sample, which are shown in Table 5 and FIG. 2, were measured with the spectrophotofluorometer. The emission wavelength of the phosphor was 583 nm and emission intensity was 0.13. The composition of the comparative example was out of the composition range of the present invention, and hence was unsuitable. Consequently, the emission wavelength of the obtained phosphor was longer than that of the present invention and the emission intensity was also low.

Next, a lighting apparatus using the phosphor which comprises the nitride of the present invention is explained.

Example 31

Figure 3:
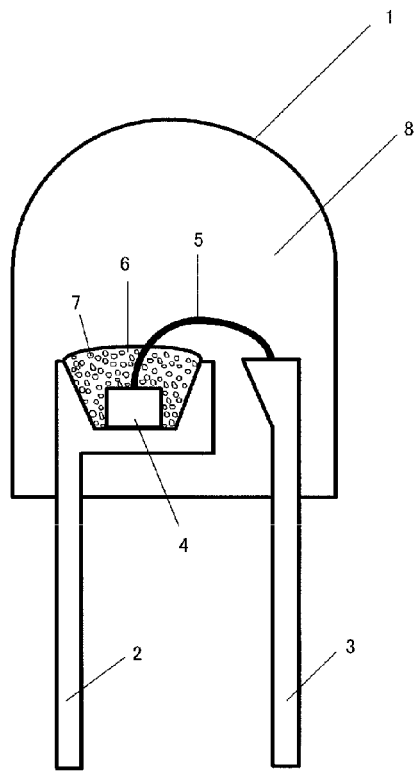
FIG. 3 is a schematic drawing of a lighting apparatus (bullet-type LED lighting apparatus) according to the present invention.

A so-called bullet-type white light-emitting diode lamp (1) shown in FIG. 3 was produced. There are two lead wires (2, 3), one of which (2) has a recess, in which a blue light-emitting diode device (4) is placed. The lower electrode of the blue light-emitting diode device (4) and the bottom surface of the recess are electrically connected with conductive paste, and the upper electrode and the other lead wire (3) are electrically connected to a gold filament (5). The phosphor used in the present example is a phosphor produced as Example 14. The phosphor (7) is dispersed in resin and mounted in the vicinity of the light-emitting diode device (4). The first resin (6) in which this phosphor is dispersed is transparent, and covers the entire blue light-emitting diode device (4). The tip portion of the lead wire including the recess, the blue light-emitting diode device, and the first resin in which the phosphor is dispersed are sealed with transparent second resin (8). The entire part of the transparent second resin (8) is roughly cylindrical, the tip portion of which is formed as a lens-like curved surface. Thus, the diode lamp is commonly called a bullet-type diode lamp.

In the present example, the phosphor powder was mixed into epoxy resin in a concentration of 35 wt %, and a proper amount of the resultant mixture was dropped using a dispenser to form the first resin (6) in which the phosphor (7) was dispersed. The resultant color coordinates were x=0.33 and y=0.33, which represent a white color.

Next, the production process of the bullet-type white light-emitting diode of this example is described. First, a blue light-emitting diode device (4) is die-bonded using conductive paste to the device-loading recess provided to one of the set of lead wires (2) to electrically connect the lead wire and the lower electrode of the blue light-emitting diode device and fix the blue light-emitting diode device (4). Then, the upper electrode of the blue light-emitting diode device (4) and the other lead wire are wire-bonded and are electrically connected. Phosphor powder is mixed with epoxy resin in a concentration of 35% by weight, and a proper amount of the resultant mixture is applied using a dispenser to the recess to cover the blue light-emitting diode device, and cured to form the first resin (6). Finally, the entire part consisting of the tip part of the lead wire including the recess, the blue light-emitting diode device and the first resin in which the phosphor is dispersed is sealed with the second resin by the casting method. In the present example, the same epoxy resin is used for both the first resin and second resin. However, transparent materials, such as other resin exemplified by silicone resin, or glass may also be applied. It is preferable to select a material which exhibits as small deterioration as possible by ultraviolet light.

Example 32

Figure 4:
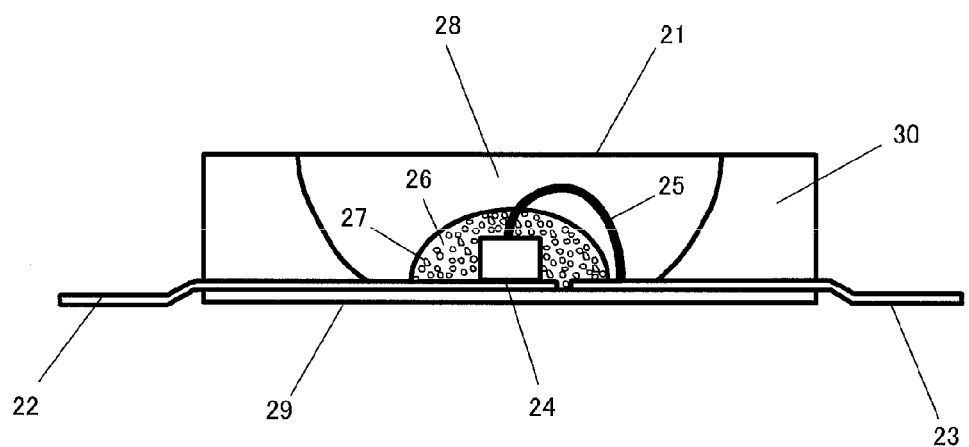
FIG. 4 is a schematic drawing of a lighting apparatus (substrate-mounted LED lighting apparatus) according to the present invention.

A tip-type white light-emitting diode lamp (21) for mounting on a substrate was produced. The structure is shown in FIG. 4. Two lead wires (22, 23) are fixed to a white alumina ceramic substrate (29) having high visible light reflectivity. One end of each of these wires is located nearly at the central part of the substrate, and the other end of each extends to the outside to serve as an electrode to be soldered when the lamp is mounted on an electric substrate. A blue light-emitting diode device (24) is placed and fixed to the one end of one (22) of the lead wires so that the diode is located at the central part of the substrate. The lower electrode of the blue light-emitting diode device (24) and the lead wire below are electrically connected with conductive paste, and the upper electrode and the other lead wire (23) are electrically connected to a gold filament (25).

A phosphor (27) is dispersed in resin (26) and mounted in the vicinity of the light emitting diode device. The first resin (26) in which this phosphor is dispersed is transparent, and covers the entire blue light-emitting diode device (24). Moreover, on the ceramic substrate, a wall surface member (30) having a hole opened at the central part is fixed. The central part of the wall surface member (30) is formed into a hole in which the first resin (26) which contains the blue light-emitting diode device (24) and the phosphor (27) dispersed therein is to be accommodated, and the portion which faces the central part forms a slope. This slope is a reflective surface for taking out a light forward, and the shape of the curved surface of that slope is determined in consideration of the direction of light reflection. Moreover, at least the surface which constitutes the reflective surface forms a surface having high visible light reflectivity with white or metallic luster. In the present example, the wall surface member is constituted of white silicone resin (30). The hole at the central part of the wall surface member forms a recess as the final shape of the tip-type light emitting diode lamp, and is filled up with second transparent resin (28) to seal all of the blue light-emitting diode device (24) and the first resin (26) in which the phosphor (27) is dispersed. In the present example, the same epoxy resin is used for both the first resin (26) and second resin (28). The ratio of phosphor addition, the attained chromaticity, and the like are approximately identical to those in the foregoing example. The production process is roughly identical with the production process of the foregoing example except that the lead wires (22, 23) and the wall surface member (30) are fixed to the alumina ceramic substrate (29).

Next, an example of design of an image display device using the phosphor of the present invention is described.

Example 33

Figure 5:
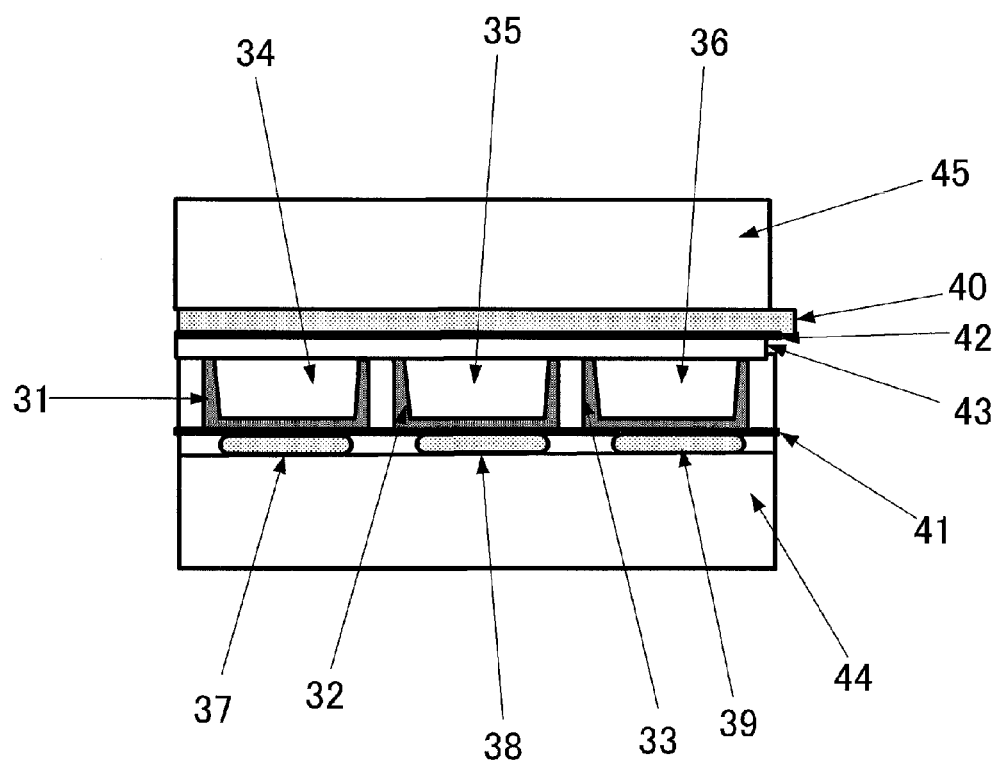
FIG. 5 is a schematic drawing of an image display device (plasma display panel) according to the present invention.

FIG. 5 is a schematic diagram of a principle of a plasma display panel as an image display device. A red color phosphor ($CaAlSiN_3:Eu^{2+}$) (31), a green color phosphor (32) of Example 14 of the present invention, and a blue color phosphor ($BaMgAl_{10}O_{17}:Eu$) (33) are applied on the internal surface of respective cells (34, 35, 36). The cells (34, 35, 36) are located on a glass substrate (44) to which a dielectric layer (41) and electrodes (37, 38, 39) are provided. If electric power is supplied to the electrodes (37, 38, 39, 40), a vacuum ultraviolet ray is generated by Xe discharge in the cells. The phosphors are excited by the vacuum ultraviolet ray to emit red, green, and blue visible lights. The emitted lights are observed from the outside through a protective layer (43), a dielectric layer (42), and a glass substrate (45) to function as an image display.

Examples 34 to 49

Silicon nitride powder, aluminum nitride powder, lithium carbonate powder, europium oxide powder and an oxide of a third metal element were mixed in compositions of Table 7 in order to obtain the design compositions (Table 6) for examining design parameters x1, x2, x3, m and n in an α-type sialon containing Li, Eu and the third metal. These powdery raw materials were weighed so that the mixture compositions of Table 7 are obtained, and mixed for 10 minutes by using an agate pestle and mortar in air. Each of the obtained mixtures were passed through a 500 μm sieve, and allowed to fall naturally into a boron nitride crucible to fill the crucible with the powder. The bulk density of the powder was about 25% to 30%.

The crucibles containing the powder mixtures were set to an electric furnace of a graphite resistance heating type. In firing, first the firing atmosphere was made vacuum with a diffusion pump, and heated from room temperature to 800° C. at a rate of 500° C. per hour. Nitrogen of 99.999% purity by volume was introduced at 800° C. to raise pressure to 1 MPa, and temperature was further raised to 1650° C. at a rate of 500° C. per hour. The reached temperature was kept constant for 8 hours.

Subsequently, the synthesized compounds were ground using an agate mortar, and powder X-ray diffraction measurements were conducted using Cu $K_\alpha$ rays. As a result, no unreacted starting materials were detected. It was confirmed that 80% or more α-type sialon was contained in all of the examples.

After firing, the obtained firing products were crushed coarsely and further ground by hand by using a crucible and mortar made of a silicon nitride sintered compact, and then allowed to pass a 30 μm-mesh sieve. As a result of irradiating these powder samples with a lamp which emits light of a wavelength of 365 nm, emission of various colors ranging from blue to red was confirmed. Table 8 shows the results of emission- and excitation spectra of these powder samples measured with a spectrophotofluorometer. In all examples, there were obtained phosphors which were efficiently excited by ultraviolet radiation, violet light and blue light with a wavelength of from 300 nm to 450 nm and emitted blue to yellow-green fluorescence which had a peak in the wavelength region of from 450 to 650 nm.

TABLE 6

| Ex- | Parameter | | | | | Design Composition (mol %) | | | | | | | | | | |
|---|---|---|---|---|---|---|---|---|---|---|---|---|---|---|---|---|
| ample | x1 | x2 | x3 | m | n | Si3N4 | AlN | Li2O | Ce2O3 | Pr2O3 | EuO | Tb2O3 | Dy2O3 | Er2O3 | Tm2O3 | Yb2O3 | Lu2O3 |
| 34 | 1.94 | 0.03 | 0 | 2 | 1 | 42.86 | 42.86 | 13.86 | 0 | 0 | 0.429 | 0 | 0 | 0 | 0 | 0 | 0 |
| 35 | 1.94 | 0.03 | 0 | 2 | 1 | 42.95 | 42.95 | 13.89 | 0 | 0 | 0 | 0 | 0 | 0 | 0 | 0.215 | 0 |
| 36 | 1.91 | 0 | 0.03 | 2 | 1 | 43.04 | 43.04 | 13.70 | 0.215 | 0 | 0 | 0 | 0 | 0 | 0 | 0 | 0 |
| 37 | 1.91 | 0 | 0.03 | 2 | 1 | 43.04 | 43.04 | 13.70 | 0 | 0.215 | 0 | 0 | 0 | 0 | 0 | 0 | 0 |
| 38 | 1.91 | 0 | 0.03 | 2 | 1 | 43.04 | 43.04 | 13.70 | 0 | 0 | 0 | 0.215 | 0 | 0 | 0 | 0 | 0 |
| 39 | 1.91 | 0 | 0.03 | 2 | 1 | 43.04 | 43.04 | 13.70 | 0 | 0 | 0 | 0 | 0.215 | 0 | 0 | 0 | 0 |
| 40 | 1.91 | 0 | 0.03 | 2 | 1 | 43.04 | 43.04 | 13.70 | 0 | 0 | 0 | 0 | 0 | 0.215 | 0 | 0 | 0 |
| 41 | 1.91 | 0 | 0.03 | 2 | 1 | 43.04 | 43.04 | 13.70 | 0 | 0 | 0 | 0 | 0 | 0 | 0.215 | 0 | 0 |
| 42 | 1.85 | 0.03 | 0.03 | 2 | 1 | 43.04 | 43.04 | 13.27 | 0 | 0 | 0.430 | 0 | 0 | 0 | 0 | 0 | 0.215 |
| 43 | 1.76 | 0.03 | 0.06 | 2 | 1 | 43.23 | 43.23 | 12.68 | 0 | 0 | 0.432 | 0 | 0 | 0 | 0 | 0 | 0.432 |
| 44 | 1.40 | 0.03 | 0.18 | 2 | 1 | 43.99 | 43.99 | 10.26 | 0 | 0 | 0.440 | 0 | 0 | 0 | 0 | 0 | 1.320 |
| 45 | 0.32 | 0.03 | 0.54 | 2 | 1 | 46.44 | 46.44 | 2.477 | 0 | 0 | 0.464 | 0 | 0 | 0 | 0 | 0 | 4.180 |
| 46 | 1.82 | 0 | 0.06 | 2 | 1 | 43.04 | 43.04 | 13.06 | 0.430 | 0 | 0 | 0 | 0 | 0 | 0 | 0 | 0.430 |
| 47 | 1.64 | 0 | 0.12 | 2 | 1 | 43.23 | 43.23 | 11.82 | 0.865 | 0 | 0 | 0 | 0 | 0 | 0 | 0 | 0.865 |
| 48 | 1.46 | 0 | 0.18 | 2 | 1 | 43.42 | 43.42 | 10.56 | 1.302 | 0 | 0 | 0 | 0 | 0 | 0 | 0 | 1.302 |
| 49 | 0.92 | 0 | 0.36 | 2 | 1 | 43.99 | 43.99 | 6.745 | 2.639 | 0 | 0 | 0 | 0 | 0 | 0 | 0 | 2.639 |

TABLE 7

| | Mixure Composition (wt %) | | | | | | | | | | | |
|---|---|---|---|---|---|---|---|---|---|---|---|---|
| Example | Si3N4 | AlN | Li2CO3 | CeO2 | Pr6O11 | Eu2O3 | Tb4O7 | Dy2O3 | Er2O3 | Tm2O3 | Yb2O3 | Lu2O3 |
| 34 | 67.793 | 19.810 | 11.55 | 0 | 0 | 0.85 | 0 | 0 | 0 | 0 | 0 | 0 |
| 35 | 67.724 | 19.790 | 11.54 | 0 | 0 | 0 | 0 | 0 | 0 | 0 | 0.95 | 0 |
| 36 | 67.926 | 19.849 | 11.39 | 0.834 | 0 | 0 | 0 | 0 | 0 | 0 | 0 | 0 |
| 37 | 67.932 | 19.851 | 11.39 | 0 | 0.82 | 0 | 0 | 0 | 0 | 0 | 0 | 0 |
| 38 | 67.877 | 19.835 | 11.38 | 0 | 0 | 0 | 0.90 | 0 | 0 | 0 | 0 | 0 |
| 39 | 67.879 | 19.835 | 11.38 | 0 | 0 | 0 | 0 | 0.90 | 0 | 0 | 0 | 0 |
| 40 | 67.863 | 19.831 | 11.38 | 0 | 0 | 0 | 0 | 0 | 0.92 | 0 | 0 | 0 |
| 41 | 67.859 | 19.829 | 11.38 | 0 | 0 | 0 | 0 | 0 | 0 | 0.93 | 0 | 0 |
| 42 | 67.505 | 19.726 | 10.96 | 0 | 0 | 0.85 | 0 | 0 | 0 | 0 | 0 | 0.96 |
| 43 | 67.220 | 19.643 | 10.39 | 0 | 0 | 0.84 | 0 | 0 | 0 | 0 | 0 | 1.91 |
| 44 | 66.104 | 19.317 | 8.12 | 0 | 0 | 0.83 | 0 | 0 | 0 | 0 | 0 | 5.63 |
| 45 | 62.965 | 18.400 | 1.77 | 0 | 0 | 0.79 | 0 | 0 | 0 | 0 | 0 | 16.08 |
| 46 | 66.450 | 19.418 | 10.62 | 1.631 | 0 | 0 | 0 | 0 | 0 | 0 | 0 | 1.89 |
| 47 | 64.849 | 18.950 | 9.34 | 3.183 | 0 | 0 | 0 | 0 | 0 | 0 | 0 | 3.68 |
| 48 | 63.327 | 18.505 | 8.12 | 4.662 | 0 | 0 | 0 | 0 | 0 | 0 | 0 | 5.39 |
| 49 | 59.156 | 17.286 | 4.78 | 8.711 | 0 | 0 | 0 | 0 | 0 | 0 | 0 | 10.07 |

TABLE 8

| Example | Emission Intensity (arb. unit) | Emission Wavelength (nm) | Excitation Wavelength (nm) |
|---|---|---|---|
| 34 | 0.56 | 568 | 407 |
| 35 | 0.07 | 534 | 437 |
| 36 | 0.30 | 477 | 238 |
| 37 | 0.30 | 616 | 264 |
| 38 | 2.03 | 544 | 247 |
| 39 | 1.86 | 578 | 245 |
| 40 | 0.04 | 546 | 231 |
| 41 | 0.22 | 797 | 247 |
| 42 | 0.56 | 566 | 412 |
| 43 | 0.55 | 568 | 425 |
| 44 | 0.59 | 572 | 449 |
| 45 | 0.55 | 581 | 289 |
| 46 | 0.25 | 477 | 376 |
| 47 | 0.28 | 478 | 381 |
| 48 | 0.31 | 488 | 389 |
| 49 | 0.27 | 504 | 399 |

INDUSTRIAL APPLICABILITY

The nitride phosphor of the present invention shows a light emission at a wavelength shorter than the conventional sialon or oxynitride phosphor does. And it is superior as a yellow-green color phosphor and shows only a small decrease of phosphor brightness when exposed to the excitation source. Thus, the nitride phosphor of the present invention can be suitably used for VFD, FED, PDP, CRT, white color LED, and the like. It is expected that the phosphor of the present invention will be much applied to various kinds of display devices in the material design so as to contribute to the development of the industry.

What is claimed is:

1. A phosphor comprising: α-type sialon crystal which is expressed by a general formula:

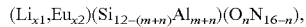

$(Li_{x1}, Eu_{x2})(Si_{12-(m+n)}Al_{m+n})(O_n N_{16-n})$, wherein x1 is an amount of solid solution of Li in a sialon unit cell, and x2 is an amount of solid solution of Eu in the sialon unit cell, wherein the parameters x1, x2, m, and n satisfy:

$1.6 \leq x1 \leq 2.4$ (1), $0.001 \leq x2 \leq 0.4$ (2), $1.8 \leq m \leq 2.4$ (3), $0.8 \leq n \leq 1.2$ (4), wherein the α-type sialon crystal emits fluorescence with a peak in a wavelength region of from 550 nm to 575 nm upon irradiation of an excitation source.

2. The phosphor according to claim 1 wherein the excitation source is an ultraviolet or visible light having wavelength that is at least 100 nm and does not exceed 500 nm.

3. The phosphor according to claim 1 wherein the fluorescence emitted upon irradiation of the excitation source has an emission color represented by (x, y) values in the CIE Chromaticity coordinate and satisfying the conditions:

$0.2 \leq x \leq 0.5$ (17), and $0.45 \leq y \leq 0.7$ (18).

4. The phosphor according to claim 1 further comprising: an amorphous phase or another crystalline phase than the α-type sialon, wherein a content amount of the α-type sialon crystal is 10 mass % or more.

5. The phosphor according to claim 4 wherein the content amount of the α-type sialon crystal is 50 mass % or more.

6. The phosphor according to claim 4 wherein the amorphous phase or the other crystalline phase is an inorganic substance having electronic conductivity.

* * * * *